US011122645B2

(12) United States Patent
Kowalski et al.

(10) Patent No.: US 11,122,645 B2
(45) Date of Patent: Sep. 14, 2021

(54) SYSTEMS AND METHODS FOR CONSTELLATION SUPERPOSITION

(71) Applicant: Sharp Kabushiki Kaisha, Sakai (JP)

(72) Inventors: John Michael Kowalski, Vancouver, WA (US); Zhanping Yin, Vancouver, WA (US); Toshizo Nogami, Vancouver, WA (US); Jia Sheng, Vancouver, WA (US)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 15/927,836

(22) Filed: Mar. 21, 2018

(65) Prior Publication Data

US 2018/0213591 A1    Jul. 26, 2018

Related U.S. Application Data

(63) Continuation of application No. 15/099,569, filed on Apr. 14, 2016, now abandoned.
(Continued)

(51) Int. Cl.
*H04W 76/27* (2018.01)
*H04J 11/00* (2006.01)
(Continued)

(52) U.S. Cl.
CPC ....... *H04W 76/27* (2018.02); *H03M 13/2707* (2013.01); *H03M 13/353* (2013.01);
(Continued)

(58) Field of Classification Search
None
See application file for complete search history.

(56) References Cited

U.S. PATENT DOCUMENTS

| 7,843,989 B2 | 11/2010 | Wu et al. |
| 8,634,345 B2 | 1/2014 | Yin et al. |

(Continued)

FOREIGN PATENT DOCUMENTS

| WO | 2014017867 A1 | 1/2014 |
| WO | 2015020127 A1 | 2/2015 |

OTHER PUBLICATIONS

3GPP TS 36.213 V11.3.0, "Evolved Universal Terrestrial Radio Access (E-UTRA); Physical layer procedures", Jul. 1, 2013, pp. 58-64, XP055306835, Retrieved from the Internet: URL:http://www.etsi.org/deliver/etsi_ts/136200_136299/136213/11.03.00_60/ts_136213v110300p.pdf [retrieved on Sep. 30, 2016].
(Continued)

*Primary Examiner* — Saad Khawar
(74) *Attorney, Agent, or Firm* — Austin Rapp

(57) ABSTRACT

A method for performing constellation superposition by an evolved Node B (eNB) includes determining an admissible data constellation for a second user equipment (UE) based on a data constellation of a first UE. The first UE and the second UE share the same time-frequency resources. The method also includes sending an indication that superposition coded modulation is being employed by the first UE and the second UE. The method further includes sending modulation and coding schemes (MCSs) and/or transmission power percentages used by each of the first UE and the second UE to the other UE.

12 Claims, 15 Drawing Sheets

Related U.S. Application Data

(60) Provisional application No. 62/148,648, filed on Apr. 16, 2015, provisional application No. 62/294,137, filed on Feb. 11, 2016.

(51) Int. Cl.

| | | |
|---|---|---|
| *H04L 27/34* | (2006.01) | |
| *H03M 13/27* | (2006.01) | |
| *H03M 13/35* | (2006.01) | |
| *H04L 1/00* | (2006.01) | |
| *H04W 72/04* | (2009.01) | |
| *H04W 52/14* | (2009.01) | |
| *H04W 52/34* | (2009.01) | |
| *H04L 27/26* | (2006.01) | |
| *H03M 13/09* | (2006.01) | |
| *H03M 13/23* | (2006.01) | |
| *H03M 13/29* | (2006.01) | |

(52) U.S. Cl.
CPC .......... *H04J 11/004* (2013.01); *H04L 1/0042* (2013.01); *H04L 1/0048* (2013.01); *H04L 27/3488* (2013.01); *H04W 72/042* (2013.01); *H03M 13/09* (2013.01); *H03M 13/23* (2013.01); *H03M 13/2957* (2013.01); *H04L 1/0025* (2013.01); *H04L 27/2634* (2013.01); *H04L 2001/0093* (2013.01); *H04W 52/143* (2013.01); *H04W 52/346* (2013.01)

(56) References Cited

U.S. PATENT DOCUMENTS

| | | | |
|---|---|---|---|
| 2005/0153663 | A1 | 7/2005 | Pan et al. |
| 2006/0025162 | A1 | 2/2006 | Cao et al. |
| 2009/0042511 | A1 | 2/2009 | Malladi |
| 2010/0271988 | A1 | 10/2010 | Jia et al. |
| 2011/0222462 | A1 | 9/2011 | Ho et al. |
| 2011/0305164 | A1 | 12/2011 | Zhang et al. |
| 2012/0208529 | A1 | 8/2012 | Shaul |
| 2012/0224545 | A1 | 9/2012 | Ohta et al. |
| 2013/0039297 | A1 | 2/2013 | Wang |
| 2013/0196700 | A1 | 8/2013 | Tiirola et al. |
| 2014/0087744 | A1 | 3/2014 | Yang et al. |
| 2014/0153488 | A1 | 6/2014 | Koivisto et al. |
| 2014/0286185 | A1 | 9/2014 | Liu et al. |
| 2015/0189629 | A1 | 7/2015 | Seo et al. |
| 2015/0312074 | A1* | 10/2015 | Zhu .................. H04W 52/16 370/329 |
| 2016/0065351 | A1 | 3/2016 | Zhang et al. |
| 2016/0173217 | A1 | 6/2016 | Sano et al. |
| 2016/0192369 | A1 | 6/2016 | Suzuki et al. |
| 2016/0234830 | A1* | 8/2016 | Kim .................. H04L 5/0091 |
| 2016/0337916 | A1 | 11/2016 | Deenoo et al. |
| 2018/0262288 | A1* | 9/2018 | Gao .................. H04W 52/346 |

OTHER PUBLICATIONS

MediaTek Inc., "New SI Proposal: Study on Downlink Multiuser Superposition Transmission for LTE," RP-150496, 3GPP TSG RAN Meeting #67, Shanghai, China, Mar. 2015.

NTT Docomo, "5G Standardization Work Plan," RP-150217, 3GPP TSG RAN #67, Shanghai, China, Mar. 2015.

Huawei, HiSilicon, "Discussion about Enhanced Multiuser Transmissions and Network Assisted Interference Cancellation", R1-150389, 3GPP TSG RAN WG1 Meeting #80, Athens, Greece, Feb. 2015.

Benjebbour, et al., "Concept and Practical Considerations of Non-orthogonal Multiple Access (NOMA) for Future Radio Access," IEEE, Jun. 2013.

3GPP TR 36.869 V13.0.0, "Technical Specification Group Radio Access Network; Advanced Wireless Services (AWS) extension band for LTE (Release 13)," Jan. 2016.

International Search Report and Written Opinion issued for PCT Patent Application No. PCT/US2016/027936, dated Jul. 18, 2016.

Office Action issued for U.S. Appl. No. 15/099,569 dated Nov. 21, 2017.

\* cited by examiner

SYSTEMS AND METHODS FOR CONSTELLATION SUPERPOSITION

RELATED APPLICATIONS

This application is a continuation of U.S. patent application Ser. No. 15/099,569 entitled "SYSTEMS AND METHODS FOR CONSTELLATION SUPERPOSITION," filed Apr. 14, 2016, which is related to and claims priority from U.S. Provisional Patent Application No. 62/148,648, entitled "SYSTEMS AND METHODS FOR CONSTELLATION SUPERPOSITION," filed on Apr. 16, 2015, and is also related to and claims priority from U.S. Provisional Patent Application No. 62/294,137, entitled "USER EQUIPMENTS, BASE STATIONS AND METHODS," filed on Feb. 11, 2016, which are all hereby incorporated by reference herein, in their entirety.

TECHNICAL FIELD

The present disclosure relates generally to communication systems. More specifically, the present disclosure relates to systems and methods for constellation superposition.

BACKGROUND

Wireless communication devices have become smaller and more powerful in order to meet consumer needs and to improve portability and convenience. Consumers have become dependent upon wireless communication devices and have come to expect reliable service, expanded areas of coverage and increased functionality. A wireless communication system may provide communication for a number of wireless communication devices, each of which may be serviced by a base station. A base station may be a device that communicates with wireless communication devices.

As wireless communication devices have advanced, improvements in communication capacity, speed, flexibility and/or efficiency have been sought. However, improving communication capacity, speed, flexibility and/or efficiency may present certain problems.

For example, wireless communication devices may communicate with one or more devices using a communication structure. However, the communication structure used may only offer limited flexibility and/or efficiency. As illustrated by this discussion, systems and methods that improve communication flexibility and/or efficiency may be beneficial.

DETAILED DESCRIPTION

Figure 1:
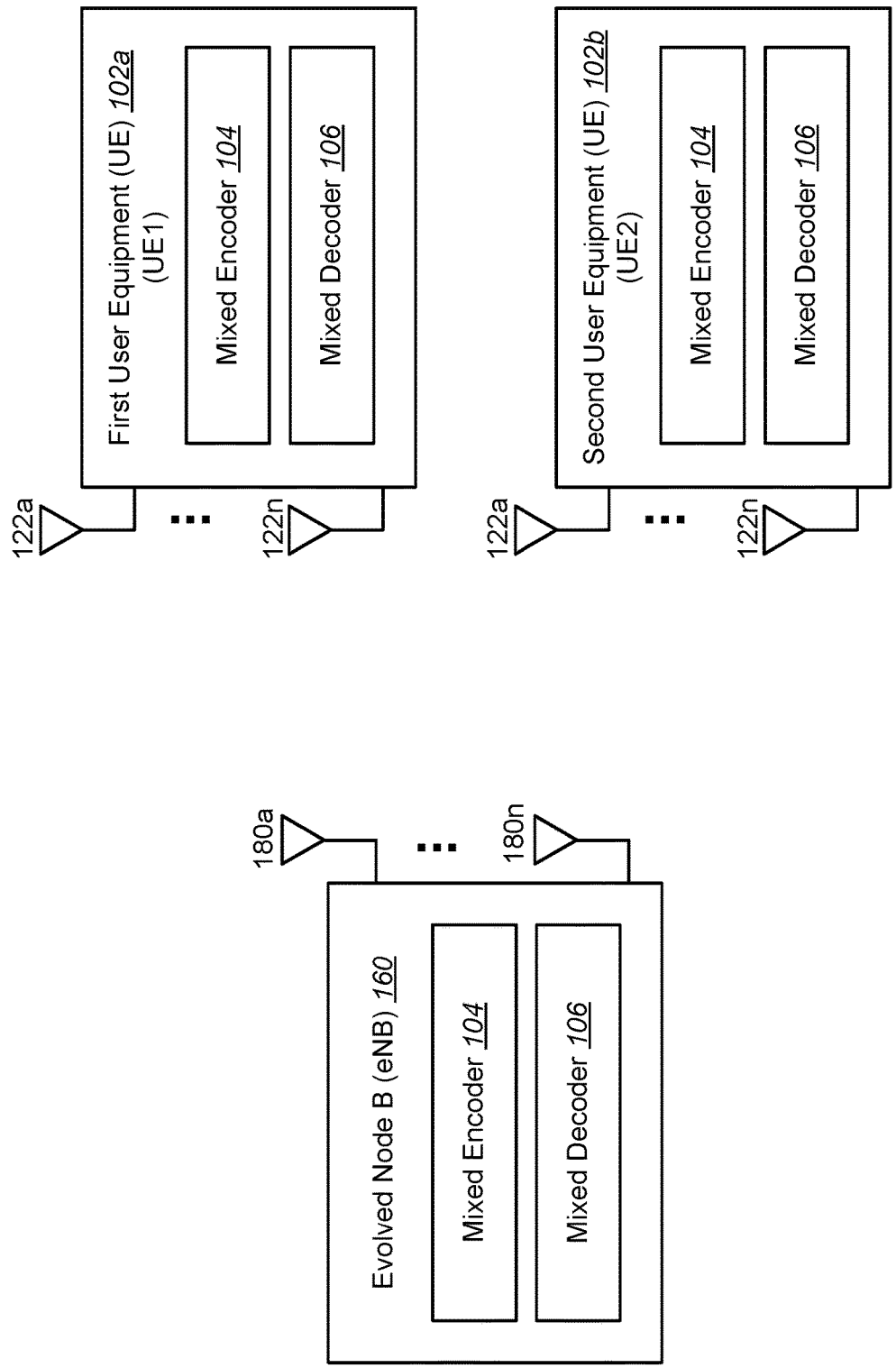
FIG. 1 is a block diagram illustrating a wireless communication system using mixed encoding and mixed decoding.

A method for performing constellation superposition by an evolved Node B (eNB) is described. The method includes determining an admissible data constellation for a second user equipment (UE) based on a data constellation of a first UE. The first UE and the second UE share the same time-frequency resources. The method also includes sending an indication that superposition coded modulation is being employed by the first UE and the second UE. The method further includes sending modulation and coding schemes (MCSs) and/or transmission power percentages used by each of the first UE and the second UE to the other UE.

Determining an admissible data constellation for the second UE based on a data constellation of a first UE may include selecting a data constellation for the second UE that is greater than or equal to a data constellation cardinality of the first UE.

Sending an indication that superposition coded modulation is being employed by the first UE and the second UE may include sending an indication that the first UE and the second UE are participating in superposition coded modulation using radio resource control (RRC) signaling. Sending an indication that superposition coded modulation is being employed by the first UE and the second UE may include sending a downlink control information (DCI) format whose purpose is to toggle successive interference canceller (SIC) receiving and to indicate that data modulation symbols are superposition coded. Sending an indication that superposition coded modulation is being employed by the first UE and the second UE may include sending a DCI format 1, 1A, 1B, 1D, 2, 2A, 2B, or 2C with an indicator that superposition coding is employed.

The method may include sending the data constellation for the second UE to the first UE using RRC signaling. The method may include sending the data constellation for the second UE to the first UE using a DCI format.

Sending the MCSs and/or the transmission power percentages used by each of the first UE and the second UE to the other UE may include sending MCS and/or transmission power percentage used by each of the first UE and the second UE to the other UE using RRC signaling.

Sending the MCSs and/or the transmission power percentages used by each of the first UE and the second UE to the other UE comprises sending MCS and/or transmission power percentage used by each of the first UE and the second UE to the other UE using a DCI format. The DCI format may be addressable by multiple UEs through transmission of either multiple radio network terminal identifiers (RNTIs) or a single group RNTI. The RNTI may be configured by RRC signaling.

A method for performing constellation superposition by a first UE is also described. The method includes receiving an indication that superposition coded modulation is being employed by the first UE and a second UE. The first UE and the second UE share the same time-frequency resources. An admissible data constellation for the second UE is based on a data constellation of the first UE. The method also includes receiving MCSs and/or transmission power percentages used by each of the first UE and the second UE.

3GPP Long Term Evolution (LTE) is the name given to a project to improve the Universal Mobile Telecommunications System (UMTS) mobile phone or device standard to cope with future requirements. In one aspect, UMTS has been modified to provide support and specification for the Evolved Universal Terrestrial Radio Access (E-UTRA) and Evolved Universal Terrestrial Radio Access Network (E-UTRAN).

At least some aspects of the systems and methods disclosed herein may be described in relation to the 3GPP LTE, LTE-Advanced (LTE-A) and other standards (e.g., 3GPP Releases 8, 9, 10, 11 and/or 12). However, the scope of the present disclosure should not be limited in this regard. At least some aspects of the systems and methods disclosed herein may be utilized in other types of wireless communication systems.

A wireless communication device may be an electronic device used to communicate voice and/or data to a base station, which in turn may communicate with a network of devices (e.g., public switched telephone network (PSTN), the Internet, etc.). In describing systems and methods herein, a wireless communication device may alternatively be referred to as a mobile station, a UE, an access terminal, a subscriber station, a mobile terminal, a remote station, a user terminal, a terminal, a subscriber unit, a mobile device, etc. Examples of wireless communication devices include cellular phones, smart phones, personal digital assistants (PDAs), laptop computers, netbooks, e-readers, wireless modems, etc. In 3GPP specifications, a wireless communication device is typically referred to as a UE. However, as the scope of the present disclosure should not be limited to the 3GPP standards, the terms "UE" and "wireless communication device" may be used interchangeably herein to mean the more general term "wireless communication device."

In 3GPP specifications, a base station is typically referred to as a Node B, an eNB, a home enhanced or evolved Node B (HeNB) or some other similar terminology. As the scope of the disclosure should not be limited to 3GPP standards, the terms "base station," "Node B," "eNB," and "HeNB" may be used interchangeably herein to mean the more general term "base station." Furthermore, one example of a "base station" is an access point. An access point may be an electronic device that provides access to a network (e.g., Local Area Network (LAN), the Internet, etc.) for wireless communication devices. The term "communication device" may be used to denote both a wireless communication device and/or a base station.

It should be noted that as used herein, a "cell" may be any communication channel that is specified by standardization or regulatory bodies to be used for International Mobile Telecommunications-Advanced (IMT-Advanced) and all of it or a subset of it may be adopted by 3GPP as licensed bands (e.g., frequency bands) to be used for communication between an eNB and a UE. It should also be noted that in E-UTRA and E-UTRAN overall description, as used herein, a "cell" may be defined as "combination of downlink and optionally uplink resources." The linking between the carrier frequency of the downlink resources and the carrier frequency of the uplink resources may be indicated in the system information transmitted on the downlink resources.

"Configured cells" are those cells of which the UE is aware and is allowed by an eNB to transmit or receive information. "Configured cell(s)" may be serving cell(s). The UE may receive system information and perform the required measurements on all configured cells. "Configured cell(s)" for a radio connection may consist of a primary cell and/or no, one, or more secondary cell(s). "Activated cells" are those configured cells on which the UE is transmitting and receiving. That is, activated cells are those cells for which the UE monitors the physical downlink control channel (PDCCH) and in the case of a downlink transmission, those cells for which the UE decodes a physical downlink shared channel (PDSCH). "Deactivated cells" are those configured cells that the UE is not monitoring the transmission PDCCH. It should be noted that a "cell" may be described in terms of differing dimensions. For example, a "cell" may have temporal, spatial (e.g., geographical) and frequency characteristics.

Various examples of the systems and methods disclosed herein are now described with reference to the Figures, where like reference numbers may indicate functionally similar elements. The systems and methods as generally described and illustrated in the Figures herein could be arranged and designed in a wide variety of different implementations. Thus, the following more detailed description of several implementations, as represented in the Figures, is not intended to limit scope, as claimed, but is merely representative of the systems and methods.

FIG. 1 is a block diagram illustrating a wireless communication system using mixed encoding and mixed decoding. An evolved node B (eNB) 160 may be in wireless communication with one or more of a first user equipment (UE) 102a (also referred to as UE1) and a second UE 102b (also referred to as UE2). An eNB 160 may be referred to as a base station device, a base station, an access point, a Node B, or some other terminology. Likewise, a UE 102 may be referred to as a mobile station, wireless communication device, a subscriber station, an access terminal, a remote station, a user terminal, a terminal, a terminal device, a handset, a subscriber unit, or some other terminology. The eNB 160 may transmit data to the UE 102 over a radio frequency (RF) communication channel.

Communication between a UE 102 and an eNB 160 may be accomplished using transmissions over a wireless link, including an uplink and a downlink. The communication link may be established using a single-input and single-output (SISO), multiple-input and single-output (MISO), a multiple-input and multiple-output (MIMO) or a multi-user MIMO (MU-MIMO) system. A MIMO system may include both a transmitter and a receiver equipped with multiple transmit and receive antennas. Thus, the eNB 160 may have multiple antennas and the UE 102 may have multiple antennas. In this way, the eNB 160 and the UE 102 may each operate as either a transmitter or a receiver in a MIMO system. A MIMO system may provide improved performance if the additional dimensionalities created by the multiple transmit and receive antennas are utilized.

The eNB 160 may include a mixed encoder 104 and a mixed decoder 106. The first UE 102a and the second UE 102b may also include a mixed encoder 104 and a mixed decoder 106. The mixed encoder 104 may encode user data and control data for transmission. Specifically, the mixed encoder 104 may introduce dependency between control data and user data using a partial superposition code, in which a control data is coded over a repeated portion of user data.

In one configuration, the wireless communication system is an LTE system. Non-orthogonal multiple access (NOMA) for the downlink of LTE may allow the same time frequency and spatial resource(s) to be scheduled to multiple receiving UEs 102. In other words, downlink transmission may be effected through non-orthogonal multiple access. NOMA may also be referred to as multiuser superposition transmission (MUST). Furthermore, a UE 102 configured to perform NOMA operations may be referred to as a MUST UE 102.

Figure 2:
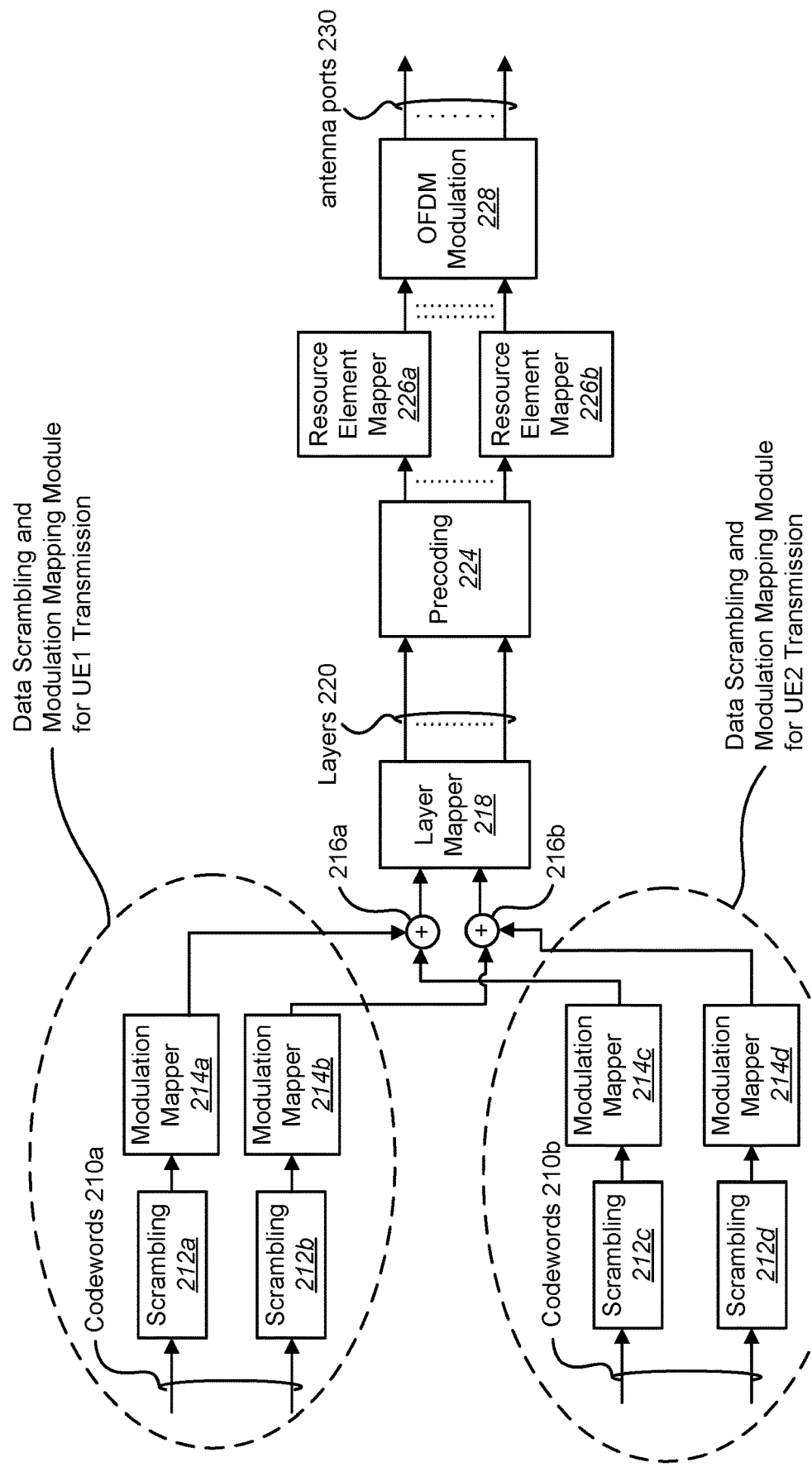
FIG. 2 is a block diagram illustrating an implementation of an evolved node B (eNB) in which systems and methods for constellation superposition may be implemented.

In one approach to NOMA, superposition of data modulated symbols may be employed. Symbol level superposition coding involves having data symbols from participating UEs 102 summed together prior to any codeword layer mapping, spatial precoding, mapping to time/frequency resources, and orthogonal frequency-division multiplexing (OFDM) modulation. For example, quadrature phase-shift keying (QPSK) symbols may be summed with 16-Quadrature Amplitude Modulation (QAM) symbols prior to OFDM (Orthogonal Code Division Modulation). FIG. 2 illustrates an implementation of an eNB 160 for symbol level superposition coding for the LTE downlink using data symbol modulation.

Alternatively, data symbol modulation may be chosen in a nonlinear fashion via a non-linear mapping of data modulation symbols. In this approach to NOMA, a non-linear superposition coding scheme may be employed where a fixed constellation (e.g., 64-QAM) is used. Constellation points may be made based on inputs from data symbols of multiple UEs 102. An example of non-linear mapping of data modulation symbols is described in connection with FIG. 3. A linear superposition symbol level coding scheme might be as described in connection with FIG. 4.

Figure 5:
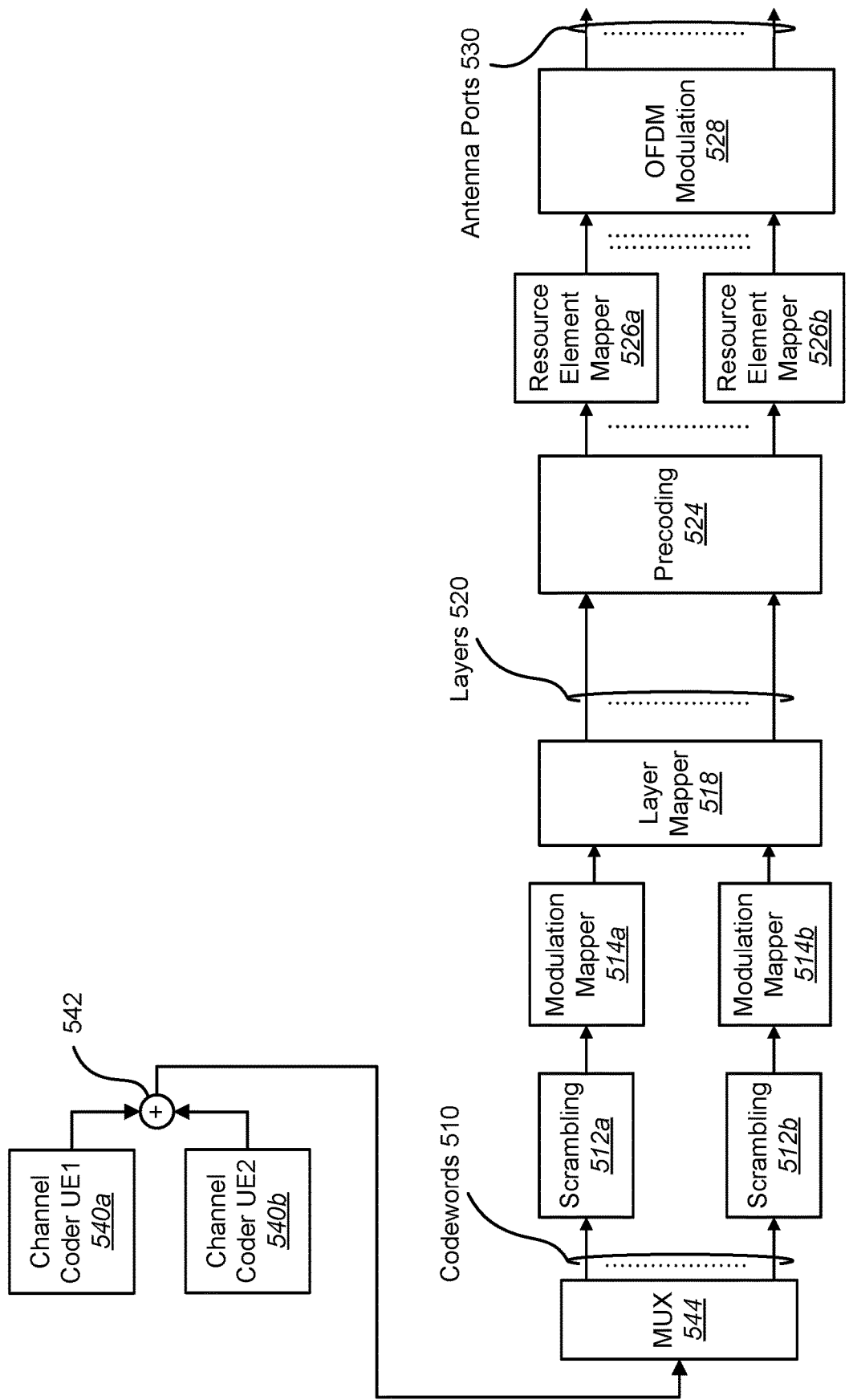
FIG. 5 is a block diagram illustrating another implementation of an eNB in which systems and methods for constellation superposition may be implemented.

In another approach, NOMA can also be achieved by superposition channel coding. In this approach, a plurality of codewords from one or more channel coders may be combined. Codeword level superposition involves summing together codewords from individual channel coders prior to modulation, scrambling, etc. One example of this type of scheme includes instances where channel coding combination is achieved through a binary summation or XOR-ing of bits of outputs of constituent codes. It should be noted that there may be other ways to achieve superposition coding. Codeword level superposition coding is a special case of joint coding, which may be achieved via linear or non-linear coding schemes. FIG. 5 illustrates an implementation of an eNB 160 for codeword level superposition coding for the LTE downlink.

For generality both symbol level superposition coding and codeword level superposition coding schemes may integrate superposition coding with MIMO. These approaches may be combined, as well as integrated with MIMO, and other functional aspects of 4G and 5G systems. These approaches employ some method of describing the way in which time and frequency resources are simultaneously shared by multiple UEs 102. Thus, for a NOMA transmission, some indication of the NOMA resource sharing scheme may be transmitted to the UEs 102 sharing the same time-frequency resources.

The present systems and methods describe how UEs 102 may be informed of how they may share time-frequency resources. In order for any of the aforementioned approaches to work in practice, certain parameters may be exchanged between the eNB 160 and the UEs 102 in question. In the case of symbol level superposition coding, a partition of subsets of the data constellation may be transmitted to the UEs 102. In the case of codeword level superposition, the appropriate subspace of codewords may be transmitted to each of the UEs 102.

When an eNB 160 informs a UE 102 of information related to MUST, a downlink control information (DCI) format size can be optimized (or semi-optimized) considering possible combinations of transmission power ratio and/or modulation and coding schemes (MCSs) of multiplexed UEs 102. An N-bit information field in the DCI format may have at least one of the following features.

At least one of the $2^N$ states may indicate that 100% of transmission power is allocated to the UE 102 for which the DCI is intended (i.e., no other UE 102 is multiplexed with the UE 102, or the UE 102 is a far-UE 102). The other effective states may indicate that less than 100% of the transmission power is allocated to the UE 102 for which the DCI is intended, and the remaining power is allocated the other UE 102 (i.e., the UE 102 is a near UE 102 and another UE 102 is multiplexed with the UE 102).

The N-bit field may indicate information other than the transmission power ratio, such as multiplexed-UE's modulation order, transport block size (TBS), physical resource block (PRB) assignment, new data indicator (NDI), redundancy version (RV), etc. In other words, the transmission power ratio may be jointly coded with the other information about the multiplexed far UE 102. The number of the state(s) indicating "100%" is just 1, or it is less than the number of the states indicating "less than 100%".

Correspondence between the states indicated by the N-bit information field and transmission power ratio may change depending on the value indicated by the other field (e.g. the MCS, NDI, RV) in the same DCI format.

FIG. 2 is a block diagram illustrating an implementation of an eNB 160 in which systems and methods for constellation superposition may be implemented. The eNB 160 described in connection with FIG. 2 may be implemented in accordance with the eNB 160 described in connection with FIG. 1. The eNB 160 may perform symbol level superposition coding for the LTE downlink using data symbol modulation.

The eNB 160 may include one or more scrambling modules 212a-d, one or more modulation mappers 214a-d, a layer mapper 218, a precoding module 224, one or more resource element mappers 226b, one or more orthogonal frequency-division multiplexing (OFDM) signal generation modules 228 and one or more antenna ports 230.

The eNB 160 may generate a baseband signal representing a downlink (DL) physical channel. Codewords 210a-b may be provided to the one or more scrambling modules 212a-d. The eNB 160 may produce the one or more codewords 210a-b based on one or more transport blocks (not shown). A codeword 210 is the output (e.g., coded bits) from a coding unit for a transport block. For example, the codewords 210 may be processed (e.g., coded) data that include downlink control information (DCI), which includes signaling to indicate a demodulation reference signal (DMRS) configuration to a UE 102.

The described systems and methods may be applicable to single-codeword and multiple-codeword transmission of single user multiple-input multiple-output (SU-MIMO) as well as single codeword and multiple codeword transmission of multi user multiple-input multiple-output (MU-MIMO). For MU-MIMO, multiple PDSCH transmissions may be targeted to multiple UEs 102, which are scheduled on the same resource block.

The codewords 210 may (optionally) be provided to the scrambling modules 212a-d. For example, the one or more scrambling modules 212a-d may scramble the codewords 210 with a scrambling sequence that is specific to a particular cell.

The (optionally scrambled) codewords may be provided to one or more modulation mappers 214a-d. The one or more modulation mappers 214a-d may map the codewords 210 to constellation points based on a particular modulation scheme (e.g., QAM, 64-QAM, Binary Phase Shift Keying (BPSK), QPSK, etc.). The modulation mappers 214a-d may generate complex-valued modulation symbols.

A first scrambling module 212a and modulation mapping module 214a may perform data scrambling and modulation mapping for first transport block for the first UE 102a (UE1) transmission. A second scrambling module 212b and modulation mapping module 214b may perform data scrambling and modulation mapping for second transport block for the first UE 102a (UE1) transmission.

A third scrambling module 212c and modulation mapping module 214c may perform data scrambling and modulation mapping for first transport block for the second UE 102b (UE2) transmission. A fourth scrambling module 212d and modulation mapping module 214d may perform data scrambling and modulation mapping for second transport block for the second UE 102b (UE2) transmission.

The modulated codeword associated with a first transport block for the first UE 102a and the modulated codeword associated with a first transport block for the second UE 102b may be combined at a first summing block 216a. The modulated codeword associated with a second transport block for the first UE 102a and the modulated codeword associated with a second transport block for the second UE 102b may be combined at a second summing block 216b.

The (modulated) codewords (e.g., complex-valued modulation symbols) may be optionally provided to a layer mapper 218. The layer mapper 218 may optionally map the codewords 210 to one or more layers 220 (for transmission on one or more spatial streams, for example).

The (optionally layer-mapped) codewords 210 may be optionally provided to the precoding module 224. The precoding module 224 may optionally pre-code the codewords 210 (e.g., complex-valued modulation symbols) on each layer 220 for transmission on the antenna ports 230.

The (optionally pre-coded) codewords 210 may be provided to one or more resource element mappers 226a-b. A resource element mapper 226 may map the codewords 210 to one or more resource elements. A resource element may be an amount of time and frequency resources on which information may be carried (e.g., sent and/or received). For example, one resource element may be defined as a particular subcarrier in an OFDM symbol for a particular amount of time.

In some configurations, each resource element may carry one modulated symbol. Accordingly, the number of bits carried in a resource element may vary. For example, each BPSK symbol carries one bit of information. Thus, each resource element that carries a BPSK symbol carries one bit. Each QPSK symbol carries two bits of information. Thus, a resource element that carries a QPSK symbol carries two bits of information. Similarly, a resource element carrying a 16-QAM symbol carries four bits of information and a resource element carrying a 64-QAM symbol carries six bits of information.

The (resource-mapped) codewords 210 may be provided to an OFDM modulation module 228. The OFDM modulation module 228 may generate OFDM signals for transmission based on the (resource-mapped) codewords 210. The OFDM signals generated by the OFDM modulation module 228 may be provided to the one or more antenna ports 230 (e.g., antennas) for transmission to the one or more UEs 102.

As illustrated in FIG. 2, an eNB 160 may perform symbol level superposition coding for the LTE downlink using data symbol modulation. With symbol level superposition coding, it may be beneficial to have a set of data symbols partitioned so that data symbols from a first UE 102a (UE1) and a second UE 102b (UE2) are chosen from well-known forms of data symbols. As used herein, it is assumed that the data symbol alphabet of UE1 has a cardinality less than or equal to UE2. Thus, UE1's data symbols can be drawn from at least the following alphabets: BPSK, QPSK, 16-QAM and 64-QAM. However, UE2's data constellation alphabets must take on values greater than or equal to the cardinality of UE1. This is depicted in Table 1. Alternatively, when the data constellation alphabet of UE1 is BPSK, the admissible data constellation alphabets for UE2 may be BPSK, 8-QAM, 32-QAM and 128-QAM.

TABLE 1

| Data Constellation Alphabets of UE1 (lower than or equal to modulation order of UE2) | Admissible Data Constellation Alphabets for UE2 |
| --- | --- |
| BPSK | BPSK, QPSK, 16-QAM, 64-QAM, 128-QAM |
| QPSK | QPSK, 16-QAM, 64-QAM |
| 16-QAM | 16-QAM |

It should be noted that because the in-phase (I) and quadrature (Q) components will typically be considered statistically independent channels, there is no benefit in specifying multiple versions of superposition coding that allow for the equivalent data constellation alphabet sizes. For example, if UE1 uses BPSK with only real values, and UE2 were to use BPSK with only imaginary values, there is no point having an operational mode in which the first UE 102a uses BPSK with only imaginary values and so forth.

Thus, if data constellation cardinality is allowed to be equal for UE1 and UE2, then 2 bits are required to signal the data constellation cardinality of first UE 102a. Furthermore, up to 3 bits are required to signal the data constellation cardinality for UE2.

On the other hand, if data constellation cardinality is prohibited to be equal for UE1 and UE2, then 2 bits are each required for the modulation the data for UE1 and UE2. In other words, a total of 4 bits are required. However, because existing modulation and coding scheme (MCS) formats need to be used to specify transport block size and coding scheme anyway, these data constellation alphabets do not need to be explicitly signaled again, in one implementation.

For optimal receiver performance it may be beneficial to signal the use of superposed constellations and the MCS to the UEs 102 in question. For example, a receiver may employ a successive interference canceller (SIC) for superposition coded modulation. Since a SIC might produce worse results if there is no signal that need be cancelled, it may be beneficial to signal the use of superposed constellations and the MCS used for that particular constellation.

In order to signal this information to the UEs 102 in question, the eNB 160 may send an indication of the use of superposed constellations and the modulation and coding scheme (MCS) used for that particular constellation. In one approach, the eNB 160 may signal to the UEs 102 that superposition coded modulation is being employed using a configuration of UEs 102 indicating that the UEs 102 are to be receiving superposed data constellations. It is important to indicate to a UE 102 that it should be using a SIC in decoding demodulated data (as well as any possible changes in the data constellations themselves) to employ Gray coding of constellation points. In another approach, the eNB 160 may send an indication to the UEs 102 in downlink control signaling that the UEs 102 in question are to be receiving superposed constellations. It should be noted that only a modulation scheme may be indicated instead of the full MCS.

At least one bit may be used to indicate the use of superposition data modulation to the UEs 102 involved. This bit may be signaled according to different approaches. In a first approach, UEs 102 participating in superposition coded modulation may be signaled using radio resource control (RRC) signaling, which (re)configures (e.g., turns on and turns off) SIC receiving. This approach has the benefit that no specification changes are needed to existing downlink control information (DCI) modulation formats.

In a second approach, UEs 102 participating in superposition coded modulation are signaled using a new DCI format. The purpose of the new DCI format is to toggle SIC receiving and indicate that data modulation symbols are superposition coded.

In a third approach, new DCI formats based on DCI format 1, 1A, 1B, 1D, 2, 2A, 2B, 2C, may be defined. These new DCI formats may include an indicator that superposition coding is employed.

If an entirely new radio access technology is specified, then DCI formats based on 1, 1A, 1B, 1D, 2, 2A, 2B, 2C may be a preferred approach. However, to facilitate backward compatibility, the first or second approaches may be used.

It may simplify receiver design and the 3GPP specifications for UE procedures to signal UE1's constellation to UE2 (and vice versa). In such a case, then 2 bits may be used to transmit UE1's constellation alphabet as per Table 1 to UE2. Additionally, 2 or 3 bits may be used to transmit UE2's constellation alphabet to UE1. The transmission of 2 or 3 bits depends on whether or not UE2 is allowed to transmit a constellation alphabet of the same cardinality as UE1 (e.g., whether UE2 can transmit QPSK when UE1 is transmitting QPSK).

These bits may be signaled according to different approaches. In a first approach, the UEs 102 participating in superposition coded modulation (e.g., UE1 and UE2) may be signaled using RRC signaling. This approach has the benefit that no specification changes are needed to existing DCI modulation formats.

In a second approach, the UEs 102 participating in superposition coded modulation (e.g., UE1 and UE2) may be signaled using a new DCI format. The purpose of this new DCI format is to inform UE1 of the data modulation that UE2 is expected to receive, and UE2 of the data modulation that UE1 is expected to receive.

In a third approach, new DCI formats based on DCI format 1, 1A, 1B, 1D, 2, 2A, 2B, 2C, may be defined. These new DCI formats may include modulation indicators as described above. For example, the DCI formats may inform UE1 of the data modulation that UE2 is expected to receive, and UE2 of the data modulation that UE1 is expected to receive.

As above, if an entirely new radio access technology is specified, then DCI formats based on 1, 1A, 1B, 1D, 2, 2A, 2B, 2C may be a preferred approach. However, to facilitate backward compatibility, the first or second approaches may be used.

A high performance SIC may include channel decoders. In LTE, these may be turbo-code decoders or convolutional code decoders. In this case, it would be beneficial to provide UEs 102 participating in superposition coded modulation with the entire MCS of the "partner UE" to aid in decoding. Such a receiver may be as depicted (in simplified form) in FIG. 6.

In the case where a high performance SIC is employed, the approaches described above may be employed to signal the MCSs used by each of the UEs 102. For example, superposition coded modulation may be signaled via the RRC signaling or DCI formats described above.

Additionally, with the third approach using the new DCI formats based on DCI format 1, 1A, 1B, 1D, 2, 2A, 2B or 2C defined with modulation indicators, these DCI formats may be addressable by multiple UEs 102 through the transmission of either multiple radio network terminal identifiers (RNTIs) or a single group RNTI by participating UEs 102. These new DCI formats may be transmitted in an (enhanced) physical downlink control channel (ePDCCH or PDCCH) group specific, which may be defined by using the group RNTI. Alternatively, these new DCI formats may be transmitted in common search spaces. The ePDCCH or PDCCH may have cyclic redundancy check (CRC) parity bits that are scrambled with the group RNTI. These RNTI(s) may be configured by RRC signaling.

In Release-12, there are ten transmission modes. These transmission modes are shown in Table 2.

TABLE 2

| Transmission mode | DCI format | Transmission scheme |
| --- | --- | --- |
| Mode 1 | DCI format 1A | Single antenna port |
|  | DCI format 1 | Single antenna port |
| Mode 2 | DCI format 1A | Transmit diversity |
|  | DCI format 1 | Transmit diversity |
| Mode 3 | DCI format 1A | Transmit diversity |
|  | DCI format 2A | Large delay CDD or Transmit diversity |
| Mode 4 | DCI format 1A | Transmit diversity |
|  | DCI format 2 | Closed-loop spatial multiplexing or Transmit diversity |
| Mode 5 | DCI format 1A | Transmit diversity |
|  | DCI format 1D | Multi-user MIMO |
| Mode 6 | DCI format 1A | Transmit diversity |
|  | DCI format 1B | Closed-loop spatial multiplexing using a single transmission layer |
| Mode 7 | DCI format 1A | Single-antenna port (for a single CRS port), transmit diversity (otherwise) |
|  | DCI format 1 | Single-antenna port |
| Mode 8 | DCI format 1A | Single-antenna port (for a single CRS port), transmit diversity (otherwise) |
|  | DCI format 2B | Dual layer transmission or single-antenna port |
| Mode 9 | DCI format 1A | Single-antenna port (for a single CRS port or MBSFN subframe), transmit diversity (otherwise) |
|  | DCI format 2C | Up to 8 layer transmission or single-antenna port |

TABLE 2-continued

| Transmission mode | DCI format | Transmission scheme |
|---|---|---|
| Mode 10 | DCI format 1A | Single-antenna port (for a single CRS port or MBSFN subframe), transmit diversity (otherwise) |
|  | DCI format 2D | Up to 8 layer transmission or single-antenna port |

Furthermore, in Release-12, there are sixteen DCI formats. DCI format 1, 1A, 1B, 1C, 1D, 2, 2A, 2B, 2C, and 2D may be used for DL assignment (also referred to as DL grant). The sixteen DCI formats are shown in Table 3.

TABLE 3

| DCI format | Use |
|---|---|
| DCI format 0 | Scheduling of PUSCH in one UL cell |
| DCI format 1 | Scheduling of one PDSCH codeword in one cell |
| DCI format 1A | Compact scheduling of one PDSCH codeword in one cell and random access procedure initiated by a PDCCH order |
| DCI format 1B | Compact scheduling of one PDSCH codeword in one cell with precoding information |
| DCI format 1C | Very compact scheduling of one PDSCH codeword, notifying MCCH change, and reconfiguring TDD |
| DCI format 1D | Compact scheduling of one PDSCH codeword in one cell with precoding and power offset information |
| DCI format 1A | Transmit diversity |
| DCI format 2 | Scheduling of up to two PDSCH codewords in one cell with precoding information |
| DCI format 2A | Scheduling of up to two PDSCH codewords in one cell |
| DCI format 2B | Scheduling of up to two PDSCH codewords in one cell with scrambling identity information |
| DCI format 2C | Scheduling of up to two PDSCH codewords in one cell with antenna port, scrambling identity and number of layers information |
| DCI format 2D | Scheduling of up to two PDSCH codewords in one cell with antenna port, scrambling identity and number of layers information and PDSCH RE Mapping and Quasi-Co-Location Indicator (PQI) information |
| DCI format 3 | Transmission of TPC commands for PUCCH and PUSCH with 2-bit power adjustments |
| DCI format 3A | Transmission of TPC commands for PUCCH and PUSCH withsingle bit power adjustments |
| DCI format 4 | Of PUSCH in one UL cell with multi-antenna port transmission mode |
| DCI format 5 | Scheduling of PSCCH, and also contains several SCI format 0 fields used for the scheduling of PSSCH |

DCI format 1, 1A, 1B, 1C, 1D may include bit fields where $N^{DL}_{RB}$ is a downlink system band width (BW) of the serving cell, which is expressed in multiples of physical resource block (PRB) bandwidth. The bit fields for DCI format 1, 1A, 1B, 1C, 1D are shown in Table 4-1.

TABLE 4-1

|  | DCI F 1 | DCI F 1A | DCI F 1B | DCI F 1C | DCI F 1D |
|---|---|---|---|---|---|
| CIF | 0 or 3 | 0 or 3 | 0 or 3 | N/A | 0 or 3 |
| Flag for format0/1A differentiation | N/A | 1 | N/A | N/A | N/A |
| Localized/Distributed VRB assignment flag | N/A | 1 | 1 | N/A | 1 |
| Resource allocation header | 1 | N/A | N/A | N/A | N/A |
| Gap value | N/A | N/A | N/A | 0 ($N^{DL}_{RB} < 50$) or 1 (otherwise) | N/A |
| Resource block assignment | * | ** | ** | *** | ** |
| Modulation and coding scheme | 5 | 5 | 5 | 5 | 5 |
| HARQ process number | 3 (FDD PCell) or 4 (TDD PCell) | 3 (FDD PCell) or 4 (TDD PCell) | 3 (FDD PCell) or 4 (TDD PCell) | N/A | 3 (FDD PCell) or 4 (TDD PCell) |
| New data indicator | 1 | 1 | 1 | N/A | 1 |
| Redundancy version | 2 | 2 | 2 | N/A | 2 |
| TPC command for PUCCH | 2 | 2 | 2 | N/A | 2 |
| Downlink Assignment Index | 0 (FDD PCell) or 2 (otherwise) | 0 (FDD PCell) or 2 (otherwise) | 0 (FDD PCell) or 2 (otherwise) | N/A | 0 (FDD PCell) or 2 (otherwise) |
| SRS request | N/A | 0 or 1 | N/A | N/A | N/A |
| Downlink power offset | N/A | N/A | N/A | N/A | 1 |
| TPMI information for precoding | N/A | N/A | 2 (2 CRS ports) or 4 (4 CRS ports) | N/A | 2 (2 CRS ports) or 4 (4 CRS ports) |
| HARQ-ACK resource offset | 2 (EPDCCH) or 0 (PDCCH) | 2 (EPDCCH) or 0 (PDCCH) | 2 (EPDCCH) or 0 (PDCCH) | N/A | 2 (EPDCCH) or 0 (PDCCH) |

In Table 4-1, "*" is ceil($N^{DL}_{RB}/P$) bits, where P is determined from Table 4-2, "" is ceil(log 2($N^{DL}_{RB}$ ($N^{DL}_{RB}$+1)/2)) bits, and "*" is ceil(log 2(floor($N^{DL}_{VRB}$, gap1/$N^{step}_{RB}$)(floor($N^{DL}_{VRB}$, gap1/$N^{step}_{RB}$)+1)/2)), bits, where $N^{DL}_{VRB}$, gap1=2*min($N_{gap}$, $N^{DL}_{RB}-N_{gap}$), $N^{step}_{RB}$ is determined from Table 4-3 and $N_{gap}$ may be determined from system bandwidth.

TABLE 4-2

| System BW $N^{DL}_{RB}$ | PRG size P |
|---|---|
| <=10 | 1 |
| 11-26 | 2 |

TABLE 4-2-continued

| System BW $N^{DL}_{RB}$ | PRG size P |
|---|---|
| 27-63 | 3 |
| 64-110 | 4 |

TABLE 4-3

| System BW $N^{DL}_{RB}$ | $N^{step}_{RB}$ |
|---|---|
| 6-49 | 2 |
| 50-110 | 4 |

DCI format 2, 2A, 2B, 2C, 2D may include the following bit fields, as shown in Table 5.

TABLE 5

| | DCI F 2 | DCI F 2A | DCI F 2B | DCI F 2C | DCI F 2D |
|---|---|---|---|---|---|
| CIF | 0 or 3 | 0 or 3 | 0 or 3 | 0 or 3 | 0 or 3 |
| Resource allocation header | 1 | 1 | 1 | 1 | 1 |
| Resource block assignment | * | * | * | * | * |
| TPC command for PUCCH | 2 | 2 | 2 | 2 | 2 |
| Downlink Assignment Index | 0 (FDD PCell) or 2 (otherwise) | 0 (FDD PCell) or 2 (otherwise) | 0 (FDD PCell) or 2 (otherwise) | 0 (FDD PCell) or 2 (otherwise) | 0 (FDD PCell) or 2 (otherwise) |
| HARQ process number | 3 (FDD PCell) or 4 (TDD PCell) | 3 (FDD PCell) or 4 (TDD PCell) | 3 (FDD PCell) or 4 (TDD PCell) | 3 (FDD PCell) or 4 (TDD PCell) | 3 (FDD PCell) or 4 (TDD PCell) |
| Scrambling identity | N/A | N/A | 1 | N/A | N/A |
| Antenna port, scrambling identity and number of layers | N/A | N/A | N/A | 3 | 3 |
| SRS request | N/A | N/A | 0 or 1 | 0 or 1 | N/A |
| Transport block to codeword swap flag | 1 | 1 | N/A | N/A | |
| Modulation and coding scheme (TB1) | 5 | 5 | 5 | 5 | 5 |
| New data indicator (TB1) | 1 | 1 | 1 | 1 | 1 |
| Redundancy version (TB1) | 2 | 2 | 2 | 2 | 2 |
| Modulation and coding scheme (TB2) | 5 | 5 | 5 | 5 | 5 |
| New data indicator (TB2) | 1 | 1 | 1 | 1 | 1 |
| Redundancy version (TB2) | 2 | 2 | 2 | 2 | 2 |
| PDSCH RE Mapping and Quasi-Co-Location Indicator | N/A | N/A | N/A | N/A | 2 |
| Precoding information | 3 (2 CRS ports) or 6 (4 CRS ports) | 0 (2 CRS ports) or 2 (4 CRS ports) | N/A | N/A | N/A |
| HARQ-ACK resource offset | 2 (EPDCCH) or 0 (PDCCH) | 2 (EPDCCH) or 0 (PDCCH) | 2 (EPDCCH) or 0 (PDCCH) | 2 (EPDCCH) or 0 (PDCCH) | 2 (EPDCCH) or 0 (PDCCH) |

For a MUST scheme, a new transmission mode (e.g., Mode 11) may be introduced. The new DCI format may be used when a UE 102 is configured with the new transmission mode. The new DCI format may be created based on one or some of the DCI formats. For example, the new DCI format may have the same information fields that DCI format 2 has. In another example, the new DCI format may have the same information fields that DCI format 2C or 2D has.

The new DCI format may have one or more new information bit field(s). The new information bit field may be introduced per transport block (e.g., Transport block 1 and Transport block 2). The bit size of the field may be 2, 3 or 4.

Table 6 shows one example of the new bit field having 2 bits, which may indicate a transmission power ratio between multiplexed UEs 102.

TABLE 6

| Bit field | Value | Transmission power coefficient, $p_{MUST,1}/(p_{MUST,1} + p_{MUST,2})$ |
|---|---|---|
| '00' | 0 | 1 (100%) |
| '01' | 1 | 0.2 (20%) |
| '10' | 2 | 0.1 (10%) |
| '11' | 3 | 0.05 (5%) |

In Table 6, $p_{MUST,1}$ denotes the transmission power for the UE 102 (referred to as UE1 hereafter) for which the concerned DCI is intended. In other words, $p_{MUST,1}$ denotes the transmission power for the PDSCH that the concerned DCI schedules. Also, $p_{MUST,2}$ denotes the transmission power of the other UE's PDSCH that is multiplexed with the UE1's PDSCH.

If the bit field indicates that 100% of the transmission power is allocated to UE1, it may mean that UE1 may assume that there is no PDSCH multiplexed with the UE1's PDSCH. In practice, the eNB 160 may set "100%" in the DCI that is intended for the far MUST UE 102 as well as in the DCI that is intended for the non-MUST-multiplexed UE 102. In this case, UE1 does not have to perform MUST reception but receives the signal assuming normal transmission. The normal transmission may also be referred to as non-MUST transmission, which is the same assumption as the UEs 102 not configured with the new DCI format monitoring.

On the other hand, is the bit field indicates that less than 100% of the transmission power is allocated to UE1, it may mean that UE1 may assume that there is PDSCH multiplexed with the UE1's PDSCH. In this case, UE1 may have to perform MUST reception. More specifically, UE1 may have to create a replica of the MUST-multiplexed PDSCH by using the information (e.g. transmission power) indicated by the bit field.

Regarding the value range of the transmission power coefficient, there may have to be at least "100%", since it may allow the network to select non-MUST transmission even when the UE 102 is configured with monitoring of the new DCI format. The other values may be much lower than 100% (e.g., less than or equal to 25%) but not "0%" so that far UEs 102 do not have to assume MUST multiplexing when they demodulate their own PDSCH.

Correspondence between the values indicated by the N-bit information field for a transport block and the corresponding parameter (e.g., transmission power ratio) may change depending on the value indicated by the other field (e.g., the modulation and coding scheme (MCS), new data indicator (NDI), redundancy version (RV)) for the same transport block in the same DCI format. To be more specific, the correspondence between the values indicated by the N-bit information field for a transport block and the corresponding parameter may be pre-defined by multiple tables, which show different associations between the field values and the parameter values. For example, if 16QAM (i.e., a modulation order of 4) is indicated by the MCS field of TB1, the new bit field may indicate transmission power ratio based on Table 6.

If QPSK (i.e., a modulation order of 2) is indicated by the MCS field of TB1, the new bit field may indicate transmission power ratio based on Table 7. The value range of the transmission power coefficient for QPSK may be relatively lower than that for higher order modulations such as 16QAM, 64QAM and 256QAM though both correspondences have "100%".

TABLE 7

| Bit field | Value | Transmission power coefficient, $p_{MUST,1}/(p_{MUST,1} + p_{MUST,2})$ |
|---|---|---|
| '00' | 0 | 1 (100%) |
| '01' | 1 | 0.1 (10%) |
| '10' | 2 | 0.05 (5%) |
| '11' | 3 | 0.025 (2.5%) |

The new bit field may indicate information other than the transmission power. For example, the new bit field may indicate a transmission scheme of the far MUST UE's PDSCH as well as the transmission power ratio, as shown in Table 8.

TABLE 8

| Bit field | Value | Transmission power coefficient, $p_{MUST,1}/(p_{MUST,1} + p_{MUST,2})$ | Transmission scheme of far MUST UE's PDSCH |
|---|---|---|---|
| '000' | 0 | 1 (100%) | — |
| '001' | 1 | 0.2 (20%) | TxD |
| '010' | 2 | 0.1 (10%) | Closed-loop spatial multiplexing |
| '011' | 3 | 0.05 (5%) | TxD |
| '100' | 4 | 0.2 (20%) | Closed-loop spatial multiplexing |
| '101' | 5 | 0.1 (10%) | TxD |
| '110' | 6 | 0.05 (5%) | Closed-loop spatial multiplexing |
| '111' | 7 | Reserved | Reserved |

As observed in Table 8, only one of values may indicate that the transmission power ratio is 100%. In this case, the transmission scheme of the far MUST UE's PDSCH is empty, since the UE 102 for which DCI is intended does not assume that the far MUST UE's PDSCH exists. Each of the other values may indicate a combination of a certain value of the transmission power ratio and the transmission scheme.

The transmission scheme of the far MUST UE's PDSCH may be set to either one of Transmit diversity (TxD) or Closed-loop spatial multiplexing. The TxD is a transmission scheme in which a precoding matrix for TxD is used while the Closed-loop spatial multiplexing is a transmission scheme in which a precoding matrix for Closed-loop spatial multiplexing is used.

Some of the values expressed by the new bit field may be reserved for use in a future release. Instead of the transmission scheme, another parameter related to the far MUST UE's PDSCH (e.g. Spatial precoding vector, modulation order, resource allocation, Demodulation reference signal (DMRS) information, PDSCH resource element (RE) mapping, HARQ information, Transport block size, RNTI, etc.) could be indicated by the new bit field.

In another example, the new bit field may be included per DCI (e.g., per PDSCH) but not per transport block. In other words, the parameter or the parameter set indicated by the single new bit field may apply to both transport blocks. More specifically, when assuming the correspondence in Table 8, value "0" may correspond to transmission power coefficients that are "100%" for both TB1 and TB2. Each of the values "1" to "6" may correspond to the corresponding transmission power coefficient value that is applied and that the corresponding transmission scheme is assumed for both TB1 and TB2 with respect to the far UE's PDSCH.

In yet another example, the new bit field may be included per DCI (i.e., per PDSCH) but not per transport block. In this example, each value potentially indicated by the single new bit field may correspond to a parameter set for both transport blocks. More specifically, when assuming the correspondence in Table 9, value "0" corresponds to transmission power coefficients that are "100%" for both TB1 and TB2. Each of the values "1" to "2" correspond to a corresponding transmission power coefficient value that applies to both TBs and TxD is assumed for both TBs as the far UE's PDSCH. Each of the values "3" to "6" correspond to a corresponding transmission power coefficient value set that applies to TB1 and TB2 and Closed-loop spatial multiplexing is assumed for both TBs as the far UE's PDSCH. With this correspondence, a single transmission scheme may have to apply to both TBs while an independent transmission power coefficient may be set per TB.

TABLE 9

| Bit field | Value | Transmission power coefficient, $p_{MUST, 1}/(p_{MUST, 1} + p_{MUST, 2})$ | Transmission scheme of far MUST UE's PDSCH |
|---|---|---|---|
| '000' | 0 | 1 (100%) for both TBs | — |
| '001' | 1 | 0.2 (20%) for both TBs | TxD |
| '010' | 2 | 0.1 (10%) for both TBs | TxD |
| '011' | 3 | 0.2 (20%) for both TBs | Closed-loop spatial multiplexing |
| '100' | 4 | 0.1 (10%) for both TBs | Closed-loop spatial multiplexing |
| '101' | 5 | 0.2 (20%) for TB1 and 0.1 (10%) for TB2 | Closed-loop spatial multiplexing |
| '110' | 6 | 0.1 (10%) for TB1 and 0.2 (20%) for TB2 | Closed-loop spatial multiplexing |
| '111' | 7 | Reserved | Reserved |

In yet another example, Table 10 may be used. More specifically, value "0" corresponds to transmission power coefficients that are "100%" for both TB1 and TB2. Each of the values "1" to "2" correspond to a corresponding transmission power coefficient value that applies to both TBs, and TxD is assumed for both TBs as the far UE's PDSCH. Each of the values "3" to "6" correspond to a corresponding transmission power coefficient value set that applies to TB1 and TB2, and Closed-loop spatial multiplexing is assumed for both TBs as the far UE's PDSCH. Each of the values "7" and "8" correspond to a corresponding transmission power coefficient value set that applies to TB1, and Closed-loop spatial multiplexing is assumed for TB1 as the far UE's PDSCH but no far UE's PDSCH is assumed to be multiplexed with TB2. Each of the values "9" and "10" correspond to a corresponding transmission power coefficient value set that applies to TB2, and Closed-loop spatial multiplexing is assumed for TB2 as the far UE's PDSCH but no far UE's PDSCH is assumed to be multiplexed with TB1.

With this correspondence, TxD may have to apply to both TBs while Closed-loop spatial multiplexing may apply to both TBs or either one of TBs.

TABLE 10

| Bit field | Value | Transmission power coefficient, $p_{MUST, 1}/(p_{MUST, 1} + p_{MUST, 2})$ | Transmission scheme of far MUST UE's PDSCH |
|---|---|---|---|
| '0000' | 0 | 1 (100%) for both TBs | — |
| '0001' | 1 | 0.2 (20%) for both TBs | TxD for both TBs |
| '0010' | 2 | 0.1 (10%) for both TBs | TxD for both TBs |
| '0011' | 3 | 0.2 (20%) for both TBs | Closed-loop spatial multiplexing for both TBs |
| '0100' | 4 | 0.1 (10%) for both TBs | Closed-loop spatial multiplexing for both TBs |
| '0101' | 5 | 0.2 (20%) for TB1 and 0.1 (10%) for TB2 | Closed-loop spatial multiplexing for both TBs |
| '0110' | 6 | 0.1 (10%) for TB1 and 0.2 (20%) for TB2 | Closed-loop spatial multiplexing for both TBs |
| '0111' | 7 | 0.2 (20%) for TB1 and 1 (100%) for TB2 | Closed-loop spatial multiplexing for TB1 |
| '1000' | 8 | 0.1 (10%) for TB1 and 1 (100%) for TB2 | Closed-loop spatial multiplexing for TB 1 |
| '1001' | 9 | 1 (100%) for TB1 and 0.2 (20%) for TB2 | Closed-loop spatial multiplexing for TB2 |
| '1010' | 10 | 1 (100%) for TB1 and 0.1 (10%) for TB2 | Closed-loop spatial multiplexing for TB2 |
| '1011' | 11 | Reserved | Reserved |
| '1100' | 12 | Reserved | Reserved |
| '1101' | 13 | Reserved | Reserved |
| '1110' | 14 | Reserved | Reserved |
| '1111' | 15 | Reserved | Reserved |

In the above-described signal design, the parameter set is optimized (or semi-optimized). This signal design may provide efficient use of control channel capacity.

The eNB 160 may configure, in the MUST UE 102, the new transmission mode. The configuration may be performed by higher layer signaling (e.g., through dedicated RRC message). The UE 102 configured with the new transmission mode may have to monitor PDCCH with the new DCI format in UE-specific search space (US S) or may monitor EPDCCH with the new DCI format in EPDCCH USS. The UE 102 configured with the new transmission mode may not require monitoring PDCCH with the new DCI format in common search space (CSS).

Alternatively, the eNB 160 may configure, in the MUST UE 102, monitoring of (E)PDCCH with the new DCI format. The configuration may be performed by higher layer signaling (e.g., through dedicated RRC message). The UE 102 configured with the monitoring of the new DCI format may have to monitor PDCCH with the new DCI format in USS or may monitor EPDCCH with the new DCI format in EPDCCH USS instead of the DCI format associated with the configured transmission mode shown in Table 2. The UE 102 configured with the monitoring of the new DCI format may not require monitoring PDCCH with the new DCI format in CSS.

Alternatively, the eNB 160 may configure, in the MUST UE 102, the presence of the new bit field in the DCI formats. The configuration may be performed by higher layer signaling (e.g., through dedicated RRC message). The UE 102 configured with the presence of the new bit field may have to monitor PDCCH with the DCI format associated with the configured transmission mode in USS or may monitor EPDCCH with the DCI format associated with the configured transmission mode in EPDCCH, assuming that the DCI format has the new bit field. The UE 102 configured with the presence of the new bit field may assume that the DCI format in CSS does not have the new bit field.

In Rel-12, the eNB 160 may determine the downlink transmit energy per resource element. A UE 102 may assume that a downlink cell-specific reference signal (RS) energy per resource element (EPRE) is constant across the downlink system bandwidth and constant across all subframes until different cell-specific RS power information is received. The downlink cell-specific reference-signal EPRE can be derived from the downlink reference-signal transmit power given by the parameter referenceSignalPower provided by higher layers. The downlink reference-signal transmit power may be defined as the linear average over the power contributions of all resource elements that carry cell-specific reference signals within the operating system bandwidth. The ratio of PDSCH EPRE to cell-specific RS EPRE among PDSCH REs (not applicable to PDSCH REs with zero EPRE) for each OFDM symbol is denoted by either $\rho_A$ or $\rho_B$ according to the OFDM symbol index as given by Table 11-1 and Table 11-2. In addition, $\rho_A$ and $\rho_B$ are UE-specific. The eNB 160 may inform the UE 102 of an absolute power of downlink cell specific RS through higher layer signaling. Table 11-1 shows OFDM symbol indices within a slot of a non-Multimedia Broadcast Single Frequency Network (MBSFN) subframe where the ratio of the corresponding PDSCH EPRE to the cell-specific RS EPRE is denoted by $\rho_A$ or $\rho_B$. Table 11-2 shows OFDM symbol indices within a slot of an MBSFN subframe where the ratio of the corresponding PDSCH EPRE to the cell-specific RS EPRE is denoted by $\rho_A$ or $\rho_B$.

TABLE 11-1

| Number of antenna ports | OFDM symbol indices within a slot where the ratio of the corresponding PDSCH EPRE to the cell-specific RS EPRE is denoted by $\rho_A$ | | OFDM symbol indices within a slot where the ratio of the corresponding PDSCH EPRE to the cell-specific RS EPRE is denoted by $\rho_B$ | |
|---|---|---|---|---|
| | Normal cyclic prefix | Extended cyclic prefix | Normal cyclic prefix | Extended cyclic prefix |
| One or two | 1, 2, 3, 5, 6 | 1, 2, 4, 5 | 0, 4 | 0, 3 |
| Four | 2, 3, 5, 6 | 2, 4, 5 | 0, 1, 4 | 0, 1, 3 |

TABLE 11-2

| Number of antenna ports | OFDM symbol indices within a slot where the ratio of the corresponding PDSCH EPRE to the cell-specific RS EPRE is denoted by $\rho_A$ | | | | OFDM symbol indices within a slot where the ratio of the corresponding PDSCH EPRE to the cell-specific RS EPRE is denoted by $\rho_B$ | | | |
|---|---|---|---|---|---|---|---|---|
| | Normal cyclic prefix | | Extended cyclic prefix | | Normal cyclic prefix | | Extended cyclic prefix | |
| | $n_s$ mod 2 = 0 | $n_s$ mod 2 = 1 | $n_s$ mod 2 = 0 | $n_s$ mod 2 = 1 | $n_s$ mod 2 = 0 | $n_s$ mod 2 = 1 | $n_s$ mod 2 = 0 | $n_s$ mod 2 = 1 |
| One or two | 1, 2, 3, 4, 5, 6 | 0, 1, 2, 3, 4, 5, 6 | 1, 2, 3, 4, 5 | 0, 1, 2, 3, 4, 5 | 0 | — | 0 | — |
| Four | 2, 3, 4, 5, 6 | 0, 1, 2, 3, 4, 5, 6 | 2, 4, 3, 5 | 0, 1, 2, 3, 4, 5 | 0, 1 | — | 0, 1 | — |

If the transmission power ratio is not indicated by the new bit field or if the transmission power ratio is set to "100%", the UE 102 may assume $\rho_A$ and $\rho_B$ as the ratio of the UE 102's PDSCH EPRE to cell-specific RS EPRE. When the transmission power ratio is indicated by the new bit field, the UE 102 may assume $y \cdot \rho_A$ and $y \cdot \rho_B$ as the ratio of the UE's PDSCH EPRE to cell-specific RS EPRE, instead of $\rho_A$ or $\rho_B$. In addition, the UE 102 may assume $(1-y) \cdot \rho_A$ and $(1-y) \cdot \rho_B$ as the ratio of the far MUST UE's PDSCH EPRE to cell-specific RS EPRE. "y" is the transmission power coefficient indicated by the new bit field, and it can also be expressed as $p_{MUST,1}/(p_{MUST,1}+p_{MUST,2})$ or $\rho_A^{MUST,1}/(\rho_A^{MUST,1}+\rho_A^{MUST,2})$.

The modulation mapper 214 takes binary digits, 0 or 1, as input and produces complex-valued modulation symbols, $x=I+jQ$, as output. If the transmission power ratio is not indicated by the new bit field or if the transmission power ratio is set to "100%", a bit sequence b(i) may be mapped to the complex-valued modulation symbols, $x=I+jQ$ based on the following tables 12-1 to 12-2 according to the modulation scheme. Table 12-1 shows QPSK modulation mapping. Table 12-2 shows 16QAM modulation mapping.

TABLE 12-1

| b(i), b(i + 1) | I | Q |
| --- | --- | --- |
| 00 | $1/\sqrt{2}$ | $1/\sqrt{2}$ |
| 01 | $1/\sqrt{2}$ | $-1/\sqrt{2}$ |
| 10 | $-1/\sqrt{2}$ | $1/\sqrt{2}$ |
| 11 | $-1/\sqrt{2}$ | $-1/\sqrt{2}$ |

TABLE 12-2

| b(i), b(i + 1), b(i + 2), b(i + 3) | I | Q |
| --- | --- | --- |
| 0000 | $1/\sqrt{10}$ | $1/\sqrt{10}$ |
| 0001 | $1/\sqrt{10}$ | $3/\sqrt{10}$ |
| 0010 | $3/\sqrt{10}$ | $1/\sqrt{10}$ |
| 0011 | $3/\sqrt{10}$ | $3/\sqrt{10}$ |
| 0100 | $1/\sqrt{10}$ | $-1/\sqrt{10}$ |
| 0101 | $1/\sqrt{10}$ | $-3/\sqrt{10}$ |
| 0110 | $3/\sqrt{10}$ | $-1/\sqrt{10}$ |
| 0111 | $3/\sqrt{10}$ | $-3/\sqrt{10}$ |
| 1000 | $-1/\sqrt{10}$ | $1/\sqrt{10}$ |
| 1001 | $-1/\sqrt{10}$ | $3/\sqrt{10}$ |
| 1010 | $-3/\sqrt{10}$ | $1/\sqrt{10}$ |
| 1011 | $-3/\sqrt{10}$ | $3/\sqrt{10}$ |
| 1100 | $-1/\sqrt{10}$ | $-1/\sqrt{10}$ |
| 1101 | $-1/\sqrt{10}$ | $-3/\sqrt{10}$ |
| 1110 | $-3/\sqrt{10}$ | $-1/\sqrt{10}$ |
| 1111 | $-3/\sqrt{10}$ | $-3/\sqrt{10}$ |

If the transmission power ratio is not indicated by the new bit field or if the transmission power ratio is set to "100%", a bit sequence b(i) may be mapped to the complex-valued modulation symbols, $x=I+jQ$ based on the following tables 13, 14-A and 14-B according to the modulation scheme, where $\alpha=\sqrt{1-y}$, $\beta=\sqrt{y}$. Table 13 shows QPSK modulation mapping. Tables 14-A and 14-B show 16QAM modulation mapping.

TABLE 13-1

| $b^{MUST,2}(j), b^{MUST,2}(j+1),$ $b^{MUST,1}(i), b^{MUST,1}(i+1)$ | I | Q |
| --- | --- | --- |
| 0000 | $\alpha/\sqrt{2} - \beta/\sqrt{2}$ | $\alpha/\sqrt{2} - \beta/\sqrt{2}$ |
| 0001 | $\alpha/\sqrt{2} - \beta/\sqrt{2}$ | $\alpha/\sqrt{2} + \beta/\sqrt{2}$ |
| 0010 | $\alpha/\sqrt{2} + \beta/\sqrt{2}$ | $\alpha/\sqrt{2} - \beta/\sqrt{2}$ |
| 0011 | $\alpha/\sqrt{2} + \beta/\sqrt{2}$ | $\alpha/\sqrt{2} + \beta/\sqrt{2}$ |

TABLE 13-1-continued

| $b^{MUST,2}(j), b^{MUST,2}(j+1),$ $b^{MUST,1}(i), b^{MUST,1}(i+1)$ | I | Q |
| --- | --- | --- |
| 0100 | $\alpha/\sqrt{2} - \beta/\sqrt{2}$ | $-\alpha/\sqrt{2} + \beta/\sqrt{2}$ |
| 0101 | $\alpha/\sqrt{2} - \beta/\sqrt{2}$ | $-\alpha/\sqrt{2} - \beta/\sqrt{2}$ |
| 0110 | $\alpha/\sqrt{2} + \beta/\sqrt{2}$ | $-\alpha/\sqrt{2} + \beta/\sqrt{2}$ |
| 0111 | $\alpha/\sqrt{2} + \beta/\sqrt{2}$ | $-\alpha/\sqrt{2} - \beta/\sqrt{2}$ |
| 1000 | $-\alpha/\sqrt{2} + \beta/\sqrt{2}$ | $\alpha/\sqrt{2} - \beta/\sqrt{2}$ |
| 1001 | $-\alpha/\sqrt{2} + \beta/\sqrt{2}$ | $\alpha/\sqrt{2} + \beta/\sqrt{2}$ |
| 1010 | $-\alpha/\sqrt{2} - \beta/\sqrt{2}$ | $\alpha/\sqrt{2} - \beta/\sqrt{2}$ |
| 1011 | $-\alpha/\sqrt{2} - \beta/\sqrt{2}$ | $\alpha/\sqrt{2} + \beta/\sqrt{2}$ |
| 1100 | $-\alpha/\sqrt{2} + \beta/\sqrt{2}$ | $-\alpha/\sqrt{2} + \beta/\sqrt{2}$ |
| 1101 | $-\alpha/\sqrt{2} + \beta/\sqrt{2}$ | $-\alpha/\sqrt{2} - \beta/\sqrt{2}$ |
| 1110 | $-\alpha/\sqrt{2} - \beta/\sqrt{2}$ | $-\alpha/\sqrt{2} + \beta/\sqrt{2}$ |
| 1111 | $-\alpha/\sqrt{2} - \beta/\sqrt{2}$ | $-\alpha/\sqrt{2} - \beta/\sqrt{2}$ |

TABLE 14-A

| $b^{MUST,2}(j), b^{MUST,2}(j+1),$ $b^{MUST,1}(i), b^{MUST,1}(i+1),$ $b^{MUST,1}(i+2), b^{MUST,1}(i+3)$ | I | Q |
| --- | --- | --- |
| 000000 | $\alpha/\sqrt{2} + \beta/\sqrt{10}$ | $\alpha/\sqrt{2} + \beta/\sqrt{10}$ |
| 000001 | $\alpha/\sqrt{2} + \beta/\sqrt{10}$ | $\alpha/\sqrt{2} + 3\beta/\sqrt{10}$ |
| 000010 | $\alpha/\sqrt{2} + 3\beta/\sqrt{10}$ | $\alpha/\sqrt{2} + \beta/\sqrt{10}$ |
| 000011 | $\alpha/\sqrt{2} + 3\beta/\sqrt{10}$ | $\alpha/\sqrt{2} + 3\beta/\sqrt{10}$ |
| 000100 | $\alpha/\sqrt{2} + \beta/\sqrt{10}$ | $\alpha/\sqrt{2} - \beta/\sqrt{10}$ |
| 000101 | $\alpha/\sqrt{2} + \beta/\sqrt{10}$ | $\alpha/\sqrt{2} - 3\beta/\sqrt{10}$ |
| 000110 | $\alpha/\sqrt{2} + 3\beta/\sqrt{10}$ | $\alpha/\sqrt{2} - \beta/\sqrt{10}$ |
| 000111 | $\alpha/\sqrt{2} + 3\beta/\sqrt{10}$ | $\alpha/\sqrt{2} - 3\beta/\sqrt{10}$ |
| 001000 | $\alpha/\sqrt{2} - \beta/\sqrt{10}$ | $\alpha/\sqrt{2} + \beta/\sqrt{10}$ |
| 001001 | $\alpha/\sqrt{2} - \beta/\sqrt{10}$ | $\alpha/\sqrt{2} + 3\beta/\sqrt{10}$ |
| 001010 | $\alpha/\sqrt{2} - 3\beta/\sqrt{10}$ | $\alpha/\sqrt{2} + \beta/\sqrt{10}$ |
| 001011 | $\alpha/\sqrt{2} - 3\beta/\sqrt{10}$ | $\alpha/\sqrt{2} + 3\beta/\sqrt{10}$ |
| 001100 | $\alpha/\sqrt{2} - \beta/\sqrt{10}$ | $\alpha/\sqrt{2} - \beta/\sqrt{10}$ |
| 001101 | $\alpha/\sqrt{2} - \beta/\sqrt{10}$ | $\alpha/\sqrt{2} - 3\beta/\sqrt{10}$ |
| 001110 | $\alpha/\sqrt{2} - 3\beta/\sqrt{10}$ | $\alpha/\sqrt{2} - \beta/\sqrt{10}$ |
| 001111 | $\alpha/\sqrt{2} - 3\beta/\sqrt{10}$ | $\alpha/\sqrt{2} - 3\beta/\sqrt{10}$ |
| 010000 | $\alpha/\sqrt{2} + \beta/\sqrt{10}$ | $-\alpha/\sqrt{2} - \beta/\sqrt{10}$ |
| 010001 | $\alpha/\sqrt{2} + \beta/\sqrt{10}$ | $-\alpha/\sqrt{2} - 3\beta/\sqrt{10}$ |
| 010010 | $\alpha/\sqrt{2} + 3\beta/\sqrt{10}$ | $-\alpha/\sqrt{2} - \beta/\sqrt{10}$ |
| 010011 | $\alpha/\sqrt{2} + 3\beta/\sqrt{10}$ | $-\alpha/\sqrt{2} - 3\beta/\sqrt{10}$ |
| 010100 | $\alpha/\sqrt{2} + \beta/\sqrt{10}$ | $-\alpha/\sqrt{2} + \beta/\sqrt{10}$ |
| 010101 | $\alpha/\sqrt{2} + \beta/\sqrt{10}$ | $-\alpha/\sqrt{2} + 3\beta/\sqrt{10}$ |
| 010110 | $\alpha/\sqrt{2} + 3\beta/\sqrt{10}$ | $-\alpha/\sqrt{2} + \beta/\sqrt{10}$ |
| 010111 | $\alpha/\sqrt{2} + 3\beta/\sqrt{10}$ | $-\alpha/\sqrt{2} + 3\beta/\sqrt{10}$ |
| 011000 | $\alpha/\sqrt{2} - \beta/\sqrt{10}$ | $-\alpha/\sqrt{2} - \beta/\sqrt{10}$ |
| 011001 | $\alpha/\sqrt{2} - \beta/\sqrt{10}$ | $-\alpha/\sqrt{2} - 3\beta/\sqrt{10}$ |
| 011010 | $\alpha/\sqrt{2} - 3\beta/\sqrt{10}$ | $-\alpha/\sqrt{2} - \beta/\sqrt{10}$ |
| 011011 | $\alpha/\sqrt{2} - 3\beta/\sqrt{10}$ | $-\alpha/\sqrt{2} - 3\beta/\sqrt{10}$ |
| 011100 | $\alpha/\sqrt{2} - \beta/\sqrt{10}$ | $-\alpha/\sqrt{2} + \beta/\sqrt{10}$ |
| 011101 | $\alpha/\sqrt{2} - \beta/\sqrt{10}$ | $-\alpha/\sqrt{2} + 3\beta/\sqrt{10}$ |
| 011110 | $\alpha/\sqrt{2} - 3\beta/\sqrt{10}$ | $-\alpha/\sqrt{2} + \beta/\sqrt{10}$ |
| 011111 | $\alpha/\sqrt{2} - 3\beta/\sqrt{10}$ | $-\alpha/\sqrt{2} + 3\beta/\sqrt{10}$ |

TABLE 14-B

| $b^{MUST,2}(j), b^{MUST,2}(j+1),$ $b^{MUST,1}(i), b^{MUST,1}(i+1),$ $b^{MUST,1}(i+2), b^{MUST,1}(i+3)$ | I | Q |
| --- | --- | --- |
| 100000 | $-\alpha/\sqrt{2} - \beta/\sqrt{10}$ | $\alpha/\sqrt{2} + \beta/\sqrt{10}$ |
| 100001 | $-\alpha/\sqrt{2} - \beta/\sqrt{10}$ | $\alpha/\sqrt{2} + 3\beta/\sqrt{10}$ |
| 100010 | $-\alpha/\sqrt{2} - 3\beta/\sqrt{10}$ | $\alpha/\sqrt{2} + \beta/\sqrt{10}$ |
| 100011 | $-\alpha/\sqrt{2} - 3\beta/\sqrt{10}$ | $\alpha/\sqrt{2} + 3\beta/\sqrt{10}$ |
| 100100 | $-\alpha/\sqrt{2} - \beta/\sqrt{10}$ | $\alpha/\sqrt{2} - \beta/\sqrt{10}$ |
| 100101 | $-\alpha/\sqrt{2} - \beta/\sqrt{10}$ | $\alpha/\sqrt{2} - 3\beta/\sqrt{10}$ |
| 100110 | $-\alpha/\sqrt{2} - 3\beta/\sqrt{10}$ | $\alpha/\sqrt{2} - \beta/\sqrt{10}$ |
| 100111 | $-\alpha/\sqrt{2} - 3\beta/\sqrt{10}$ | $\alpha/\sqrt{2} - 3\beta/\sqrt{10}$ |
| 101000 | $-\alpha/\sqrt{2} + \beta/\sqrt{10}$ | $\alpha/\sqrt{2} + \beta/\sqrt{10}$ |
| 101001 | $-\alpha/\sqrt{2} + \beta/\sqrt{10}$ | $\alpha/\sqrt{2} + 3\beta/\sqrt{10}$ |
| 101010 | $-\alpha/\sqrt{2} + 3\beta/\sqrt{10}$ | $\alpha/\sqrt{2} + \beta/\sqrt{10}$ |
| 101011 | $-\alpha/\sqrt{2} + 3\beta/\sqrt{10}$ | $\alpha/\sqrt{2} + 3\beta/\sqrt{10}$ |
| 101100 | $-\alpha/\sqrt{2} + \beta/\sqrt{10}$ | $\alpha/\sqrt{2} - \beta/\sqrt{10}$ |
| 101101 | $-\alpha/\sqrt{2} + \beta/\sqrt{10}$ | $\alpha/\sqrt{2} - 3\beta/\sqrt{10}$ |

TABLE 14-B-continued

| $b^{MUST, 2}$ (j), $b^{MUST, 2}$ (j + 1), $b^{MUST, 1}$ (i), $b^{MUST, 1}$ (i + 1), $b^{MUST, 1}$ (i + 2), $b^{MUST, 1}$ (i + 3) | I | Q |
|---|---|---|
| 101110 | $-\alpha/\sqrt{2} + 3\beta/\sqrt{10}$ | $\alpha/\sqrt{2} - \beta/\sqrt{10}$ |
| 101111 | $-\alpha/\sqrt{2} + 3\beta/\sqrt{10}$ | $\alpha/\sqrt{2} - 3\beta/\sqrt{10}$ |
| 110000 | $-\alpha/\sqrt{2} - \beta/\sqrt{10}$ | $-\alpha/\sqrt{2} - \beta/\sqrt{10}$ |
| 110001 | $-\alpha/\sqrt{2} - \beta/\sqrt{10}$ | $-\alpha/\sqrt{2} - 3\beta/\sqrt{10}$ |
| 110010 | $-\alpha/\sqrt{2} - 3\beta/\sqrt{10}$ | $-\alpha/\sqrt{2} - \beta/\sqrt{10}$ |
| 110011 | $-\alpha/\sqrt{2} - 3\beta/\sqrt{10}$ | $-\alpha/\sqrt{2} - 3\beta/\sqrt{10}$ |
| 110100 | $-\alpha/\sqrt{2} - \beta/\sqrt{10}$ | $-\alpha/\sqrt{2} + \beta/\sqrt{10}$ |
| 110101 | $-\alpha/\sqrt{2} - \beta/\sqrt{10}$ | $-\alpha/\sqrt{2} + 3\beta/\sqrt{10}$ |
| 110110 | $-\alpha/\sqrt{2} - 3\beta/\sqrt{10}$ | $-\alpha/\sqrt{2} + \beta/\sqrt{10}$ |
| 110111 | $-\alpha/\sqrt{2} - 3\beta/\sqrt{10}$ | $-\alpha/\sqrt{2} + 3\beta/\sqrt{10}$ |
| 111000 | $-\alpha/\sqrt{2} + \beta/\sqrt{10}$ | $-\alpha/\sqrt{2} - \beta/\sqrt{10}$ |
| 111001 | $-\alpha/\sqrt{2} + \beta/\sqrt{10}$ | $-\alpha/\sqrt{2} - 3\beta/\sqrt{10}$ |
| 111010 | $-\alpha/\sqrt{2} + 3\beta/\sqrt{10}$ | $-\alpha/\sqrt{2} - \beta/\sqrt{10}$ |
| 111011 | $-\alpha/\sqrt{2} + 3\beta/\sqrt{10}$ | $-\alpha/\sqrt{2} - 3\beta/\sqrt{10}$ |
| 111100 | $-\alpha/\sqrt{2} + \beta/\sqrt{10}$ | $-\alpha/\sqrt{2} + \beta/\sqrt{10}$ |
| 111101 | $-\alpha/\sqrt{2} + \beta/\sqrt{10}$ | $-\alpha/\sqrt{2} + 3\beta/\sqrt{10}$ |
| 111110 | $-\alpha/\sqrt{2} + 3\beta/\sqrt{10}$ | $-\alpha/\sqrt{2} + \beta/\sqrt{10}$ |
| 111111 | $-\alpha/\sqrt{2} + 3\beta/\sqrt{10}$ | $-\alpha/\sqrt{2} + 3\beta/\sqrt{10}$ |

Figure 3:
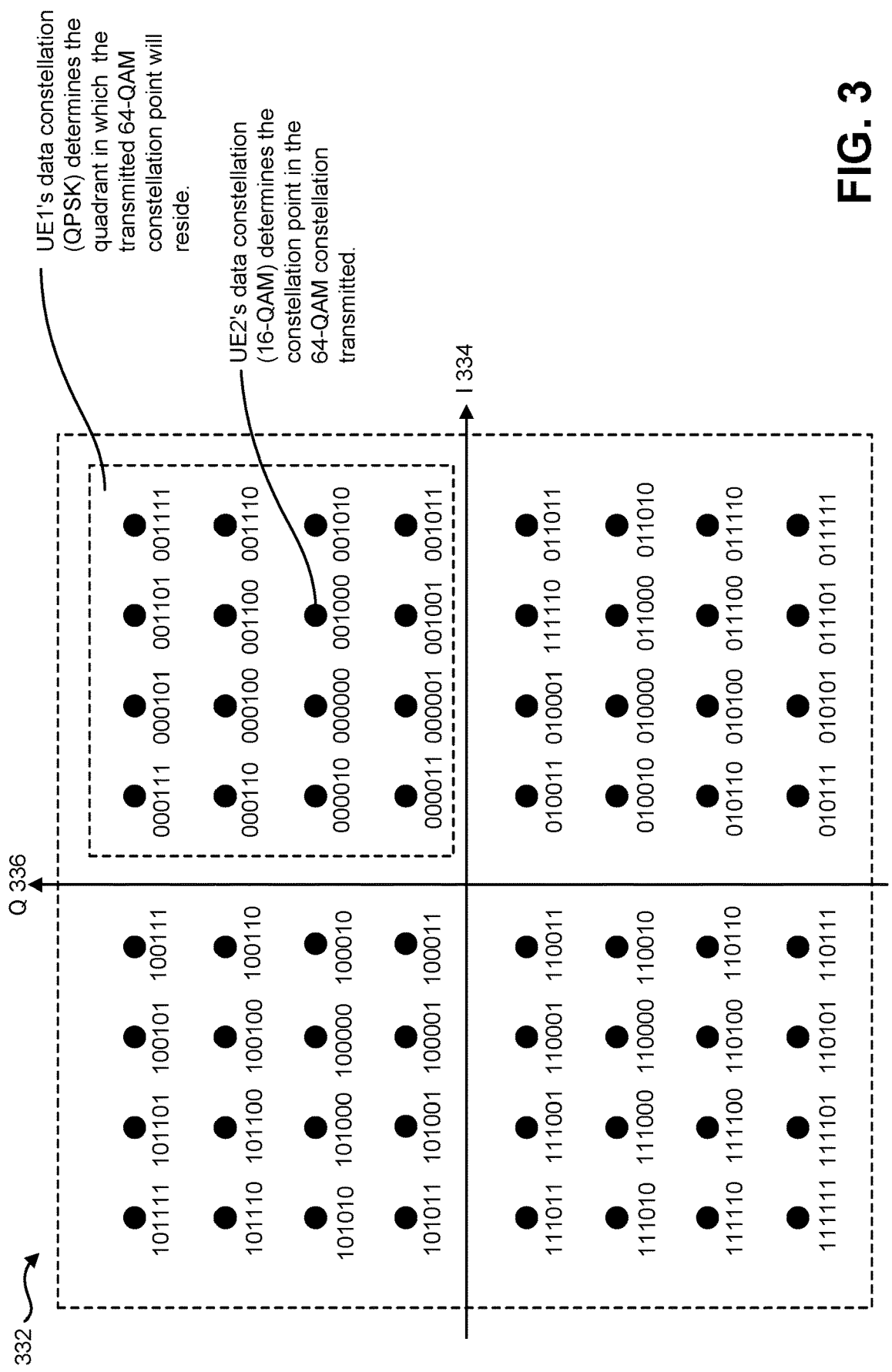
FIG. 3 is an example of nonlinear symbol level superposition.

FIG. 3 is an example of nonlinear symbol level superposition. A constellation diagram 332 is represented with an in-phase (I) component 334 and a quadrature phase (Q) component 336. This is an example of nonlinear symbol level superposition coding. Data symbol modulation may be chosen in a nonlinear fashion via a non-linear mapping of data modulation symbols.

In this example, the non-linear superposition coding scheme uses a fixed constellation (e.g., 64-QAM). Constellation points are made based on inputs from data symbols of multiple UEs 102.

A first UE 102a (UE1) may have a QPSK data constellation. This data constellation may determine the quadrant in which the transmitted 64-QAM constellation point will reside. A second UE 102b (UE2) may have a 16-QAM data constellation. This data constellation may determine the constellation point in the 64-QAM constellation transmitted.

Figure 4:
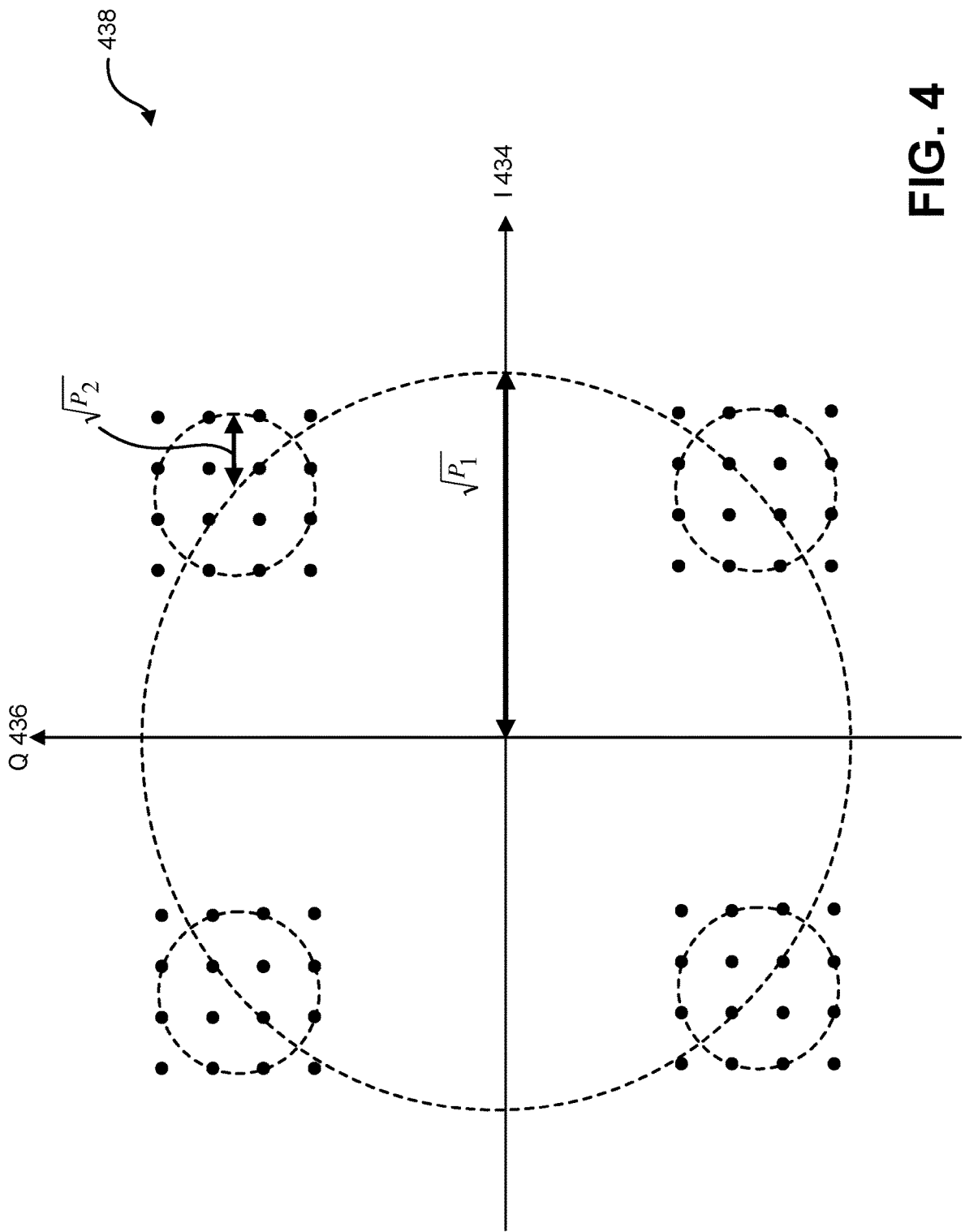
FIG. 4 is an example of linear symbol level superposition.

FIG. 4 is an example of linear symbol level superposition. A constellation diagram 438 is represented with an in-phase (I) component 434 and a quadrature phase (Q) component 436.

Symbol level superposition coding may involve having data symbols from participating UEs 102 summed together prior to any codeword layer mapping, spatial precoding, mapping to time/frequency resources, and OFDM modulation. In this example, QPSK symbols may be summed with 16-QAM symbols prior to performing OFDM. The data constellation is a vector sum. The vectors are represented in FIG. 4 as $\sqrt{P_1}$ and $\sqrt{P_2}$.

FIG. 5 is a block diagram illustrating another implementation of an eNB 160 in which systems and methods for constellation superposition may be implemented. The eNB 160 described in connection with FIG. 5 may be implemented in accordance with the eNB 160 described in connection with FIG. 1. The eNB 160 may perform code level superposition coding for the LTE downlink.

The eNB 160 may include one or more scrambling modules 512a-b, one or more modulation mappers 514a-b, a layer mapper 518, a precoding module 524, one or more resource element mappers 526a-b, one or more orthogonal frequency-division multiplexing (OFDM) modulation module 528 and one or more antenna ports 530.

The described systems and methods may be applicable to single-codeword and multiple-codeword transmission of single user multiple-input multiple-output (SU-MIMO) as well as single-codeword and multiple-codeword transmission of multi user multiple-input multiple-output (MU-MIMO). For MU-MIMO, multiple PDSCH transmissions may be targeted to multiple UEs 102, which are scheduled on the same resource block.

The eNB 160 may generate a baseband signal representing a DL physical channel. The eNB 160 may include a channel coder 540a for a first UE 102a (UE1) and a channel coder 540b for a second UE 102b (UE2). The coded data may be combined at a summation block 542. The combined signal may be provided to a multiplexor (MUX) 544 that generates codewords 510. The eNB 160 may produce one or more codewords 510 based on one or more transport blocks.

The codewords 510 may (optionally) be provided to the scrambling modules 512a-b. For example, the one or more scrambling modules 512a-b may scramble the codewords 510 with a scrambling sequence that is specific to a particular cell, as described above in connection with FIG. 2.

The (optionally scrambled) codewords 510 may be provided to the one or more modulation mappers 514a-b. The modulation mappers 514a-b may generate complex-valued modulation symbols, as described above in connection with FIG. 2.

The (modulated) codewords 510 (e.g., complex-valued modulation symbols) may be optionally provided to the layer mapper 518. The layer mapper 518 may optionally map the codewords to one or more layers 520, as described above in connection with FIG. 2.

The (optionally layer-mapped) codewords 510 may be optionally provided to the precoding module 524. The precoding module 524 may optionally pre-code the codewords 510 (e.g., complex-valued modulation symbols) on each layer for transmission on the antenna ports 530.

The (optionally pre-coded) codewords 510 may be provided to the one or more resource element mappers 526a-b. The resource element mapper may map the codewords 510 to one or more resource elements, as described above in connection with FIG. 2.

The (optionally resource-mapped) codewords 510 may be provided to the OFDM modulation module 528. The OFDM modulation module 528 may generate OFDM signals for transmission based on the (resource-mapped) codewords 510. The OFDM signals generated by the OFDM modulation module 528 may be provided to the one or more antenna ports 530 (e.g., antennas) for transmission to the one or more UEs 102.

As illustrated in FIG. 5, an eNB 160 may perform codeword level superposition coding for the LTE downlink. With codeword level superposition coding, the appropriate subspace of codewords may be transmitted to each UE 102. FIG. 5 illustrates the integration of codeword level superposition with MIMO. Codeword level superposition involves summing together codewords (i.e., binary XOR-ing the codewords) from individual channel coders prior to modulation, scrambling, etc. Codeword level superposition coding is a special case of joint coding, which may be achieved via linear or non-linear coding schemes.

With codeword level superposition (as with symbol level superposition described in connection with FIG. 2), a set of data symbols may be partitioned so that data symbols from a first UE 102a (UE1) and a second UE 102b (UE2) are chosen from well-known forms of data symbols. This may be accomplished as depicted in Table 1. As described above, because the in-phase (I) and quadrature (Q) components will typically be considered statistically independent channels, there is no benefit in specifying multiple versions of superposition coding that allow for the equivalent data constellation alphabet sizes.

The eNB 160 may signal the use of superposed constellations and the MCS to the UEs 102 in question. In order to signal this information to the UEs 102 (e.g., UE1 and UE2), the eNB 160 may send an indication the use of superposed constellations and the MCS used for that particular constellation. This may be accomplished according to the approaches as described in connection with FIG. 2. For example, the eNB 160 may provide configuration or signaling that superposition coded modulation is being employed via new DCI formats or RRC signaling. The eNB 160 may also transmit the MCSs to multiple UEs 102 via new DCI formats or RRC signaling.

Figure 6:
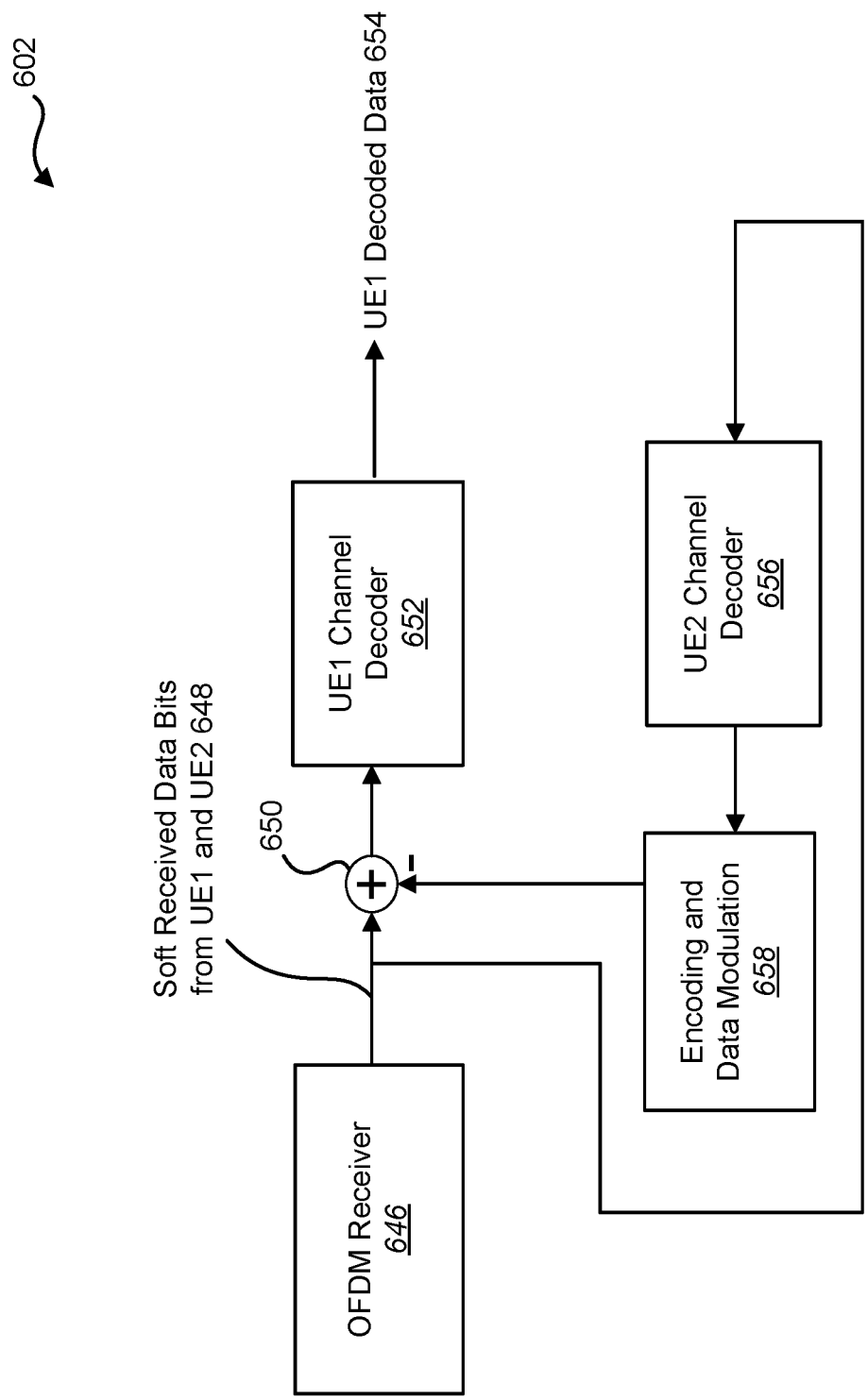
FIG. 6 is a block diagram illustrating a user equipment (UE) for implementing successive interference canceller (SIC) receiving according to the described constellation superposition.

FIG. 6 is a block diagram illustrating a UE 602 for implementing successive interference canceller (SIC) receiving according to the described constellation superposition. The UE 602 described in FIG. 6 may be referred to as a first UE 102a (UE1). The UE 602 and a second UE 102b (UE2) may be intended recipients of a MIMO transmission from an eNB 160.

The UE 602 may perform SIC to decode data intended for the UE 602. For example, the UE 602 may include an OFDM receiver 646. The UE 602 may receive a signal from the eNB 160 at the OFDM receiver 646. The UE 602 may include channel decoders to decode the received signal. In LTE, these channel decoders may be turbo-code decoders or convolutional code decoders. The UE 602 may include a UE1 channel decoder 652 and a UE2 channel decoder 656.

According to the systems and methods described herein, the UE 602 may receive a signal that indicates the use of superposed constellations by the UE 602 and the second UE 102b. The UE 602 may receive this indication via new DCI formats or RRC signaling, as described in connection with FIG. 2. The UE 602 may also receive (from the eNB 160) the MCS used by the UE 602 and the second UE 102b. Additionally, the UE 602 may receive the signal constellation used by the second UE 102b.

The UE 602 may toggle SIC receiving based on the indication that data modulation symbols are superposition coded for the UE 602 and the second UE 102b. If there is no signal to cancel, SIC might produce worse results. When data modulation symbols are superposition coded, the UE 602 may enable (e.g., turn on) SIC. When data modulation symbols are not superposition coded, the UE 602 may disable (e.g., turn off) SIC.

In the case when data modulation symbols are superposition coded, the OFDM receiver may generate combined soft received data bits 648 for the UE 602 and the second UE 102b. A channel decoder for the second UE 102b (i.e., UE2 channel decoder 656) may decode the soft received data bits 648 of the second UE 102b using the provided MCS and the signal constellation (if provided) of the second UE 102b to produce decoded data of the second UE 102b. An encoding and data modulation module 658 may re-encode and data modulate the decoded data of the second UE 102b using the MCS of the second UE 102b to produce soft data bits for the second UE 102b.

A summing block 650 may subtract the soft data bits for the second UE 102b from the combined soft received data bits 648 for the UE 602 and the second UE 102b. The output of the summing block may be the soft data bits for the UE 602.

A channel decoder for the UE 602 (i.e., UE1 channel decoder 652) may receive the soft data bits for the UE 602. The UE1 channel decoder 652 may decode the soft data bits for the UE 602 to generate decoded data 654 for the UE 602.

Figure 7:
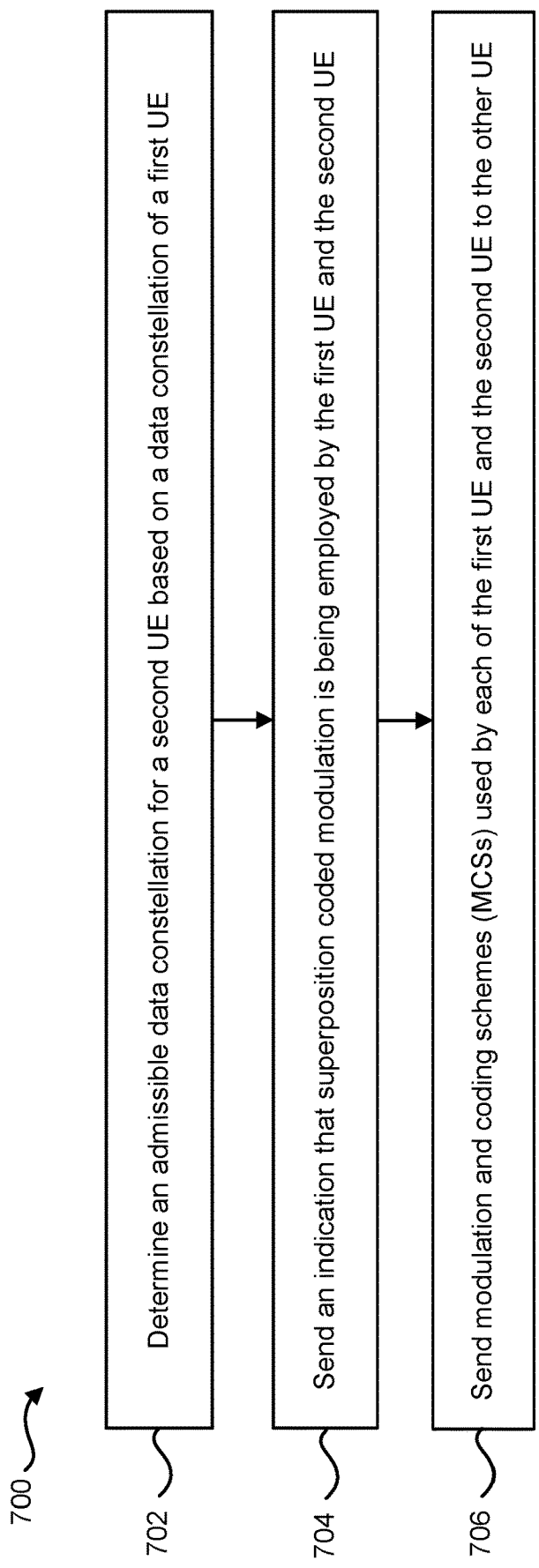
FIG. 7 is a flow diagram illustrating one implementation of a method constellation superposition by an eNB.

FIG. 7 is a flow diagram illustrating one implementation of a method 700 for constellation superposition by an eNB 160. The eNB 160 may communicate with a first UE 102a and a second UE 102b. For example, the eNB 160 may perform a NOMA transmission with the first UE 102a and the second UE 102b.

The eNB 160 may determine 702 an admissible data constellation for the second UE 102b based on a data constellation of the first UE 102a. For example, the eNB 160 may select a data constellation for the second UE 102b that is greater than or equal to the data constellation cardinality of the first UE 102a. This may be accomplished according to Table 1. In an implementation, the eNB 160 may send the data constellation for the second UE 102b to the first UE 102a using RRC signaling or a DCI format.

The eNB 160 may send 704 an indication that superposition coded modulation is being employed by the first UE 102a and the second UE 102b. In one approach, the eNB 160 may send 704 an indication that the first UE 102a and the second UE 102b are participating in superposition coded modulation using RRC signaling. In another approach, the eNB 160 may send 704 a DCI format whose purpose is to toggle SIC receiving and to indicate that data modulation symbols are superposition coded. In yet another approach, the eNB 160 may send a new DCI format based on DCI format 1, 1A, 1B, 1D, 2, 2A, 2B, or 2C with an indicator that superposition coding is employed.

The eNB 160 may send 706 modulation and coding schemes (MCSs) used by each of the first UE 102a and the second UE 102b to the other UE 102. In one approach, the eNB 160 may send 706 the MCSs used by each of the first UE 102a and the second UE 102b to the other UE 102 using RRC signaling or a DCI format. The DCI format may be addressable by multiple UEs 102 through transmission of either multiple Radio Network Terminal Identifiers (RNTIs) or a single group RNTI. The one or more RNTI may be configured by RRC signaling.

Figure 8:
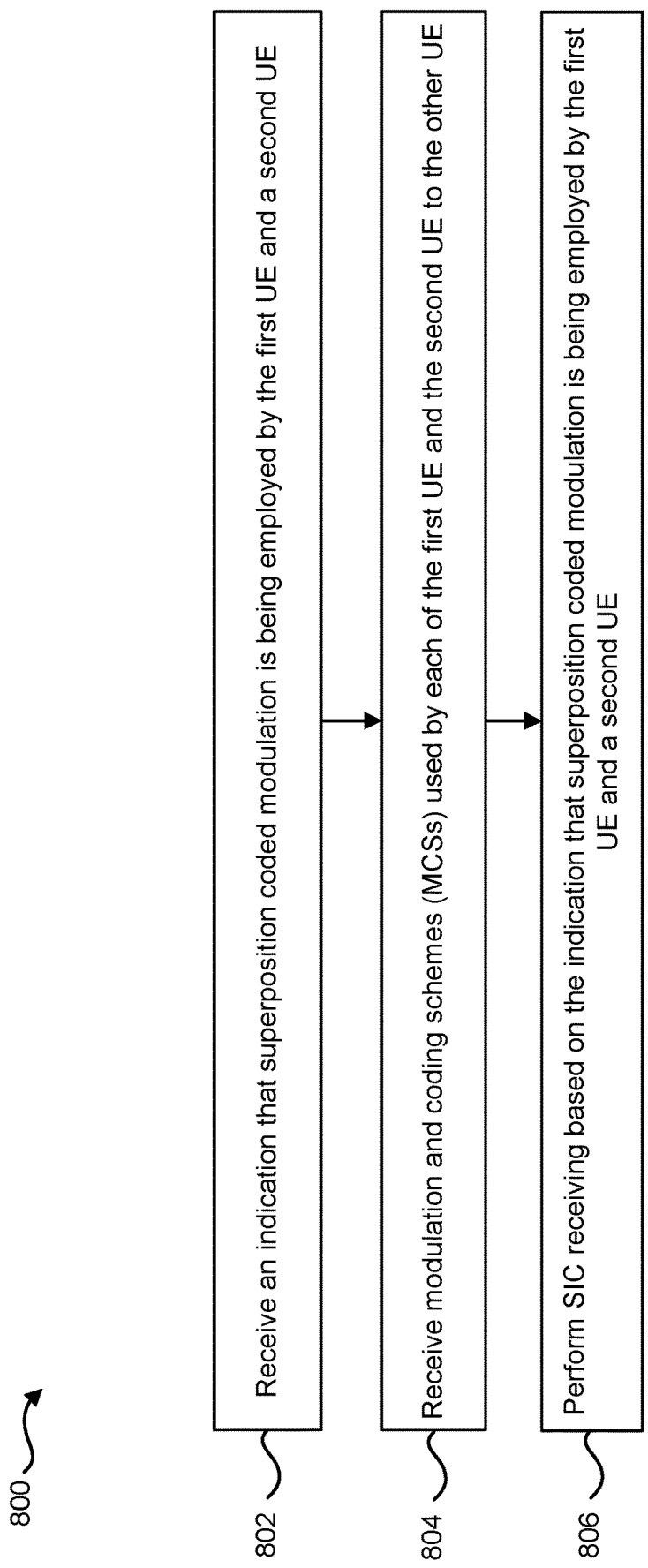
FIG. 8 is a flow diagram illustrating one implementation of a method for employing constellation superposition by a first UE.

FIG. 8 is a flow diagram illustrating one implementation of a method 800 for employing constellation superposition by a first UE 102a. The first UE 102a may communicate with an eNB 160. For example, the first UE 102a may receive a NOMA transmission from the eNB 160 that is intended for the first UE 102a and a second UE 102b.

The first UE 102a may receive 802 an indication that superposition coded modulation is being employed by the first UE 102a and a second UE 102b. An admissible data constellation for the second UE 102b may be based on a data constellation of the first UE 102a. For example, the data constellation for the second UE 102b may be selected (by the eNB 160) that is greater than or equal to the data constellation cardinality of the first UE 102a. This may be accomplished according to Table 1. The first UE 102a may receive the data constellation for the second UE 102b from the eNB 160 using RRC signaling or a DCI format.

In one approach, the first UE 102a may receive 802 the indication that the first UE 102a and the second UE 102b are participating in superposition coded modulation using RRC signaling. In another approach, the first UE 102a may receive 802 a DCI format whose purpose is to toggle SIC receiving and to indicate that data modulation symbols are superposition coded. In yet another approach, the first UE 102a may receive 802 a new DCI format based on DCI format 1, 1A, 1B, 1D, 2, 2A, 2B, or 2C with an indicator that superposition coding is employed.

The first UE 102a may receive 804 MCSs used by each of the first UE 102a and the second UE 102b. The first UE 102a may receive 804 the MCSs used by each of the first UE 102a and the second using RRC signaling or a DCI format. The DCI format may be addressable by the first UE 102a through reception of one of multiple Radio Network Terminal Identifiers (RNTIs) or a single group RNTI. The one or more RNTI may be configured by RRC signaling.

The first UE 102*a* may perform 806 SIC receiving based on the indication that superposition coded modulation is being employed by the first UE 102*a* and a second UE 102*b*. If superposition coded modulation is indicated to be employed by the first UE 102*a* and a second UE 102*b*, then SIC receiving is enabled and performed using the received MCSs used by each of the first UE 102*a* and the second UE 102*b*. This may be accomplished as described in connection with FIG. 6. If superposition coded modulation is indicated to not be employed by the first UE 102*a* and a second UE 102*b*, then SIC receiving is disabled.

Figure 9:
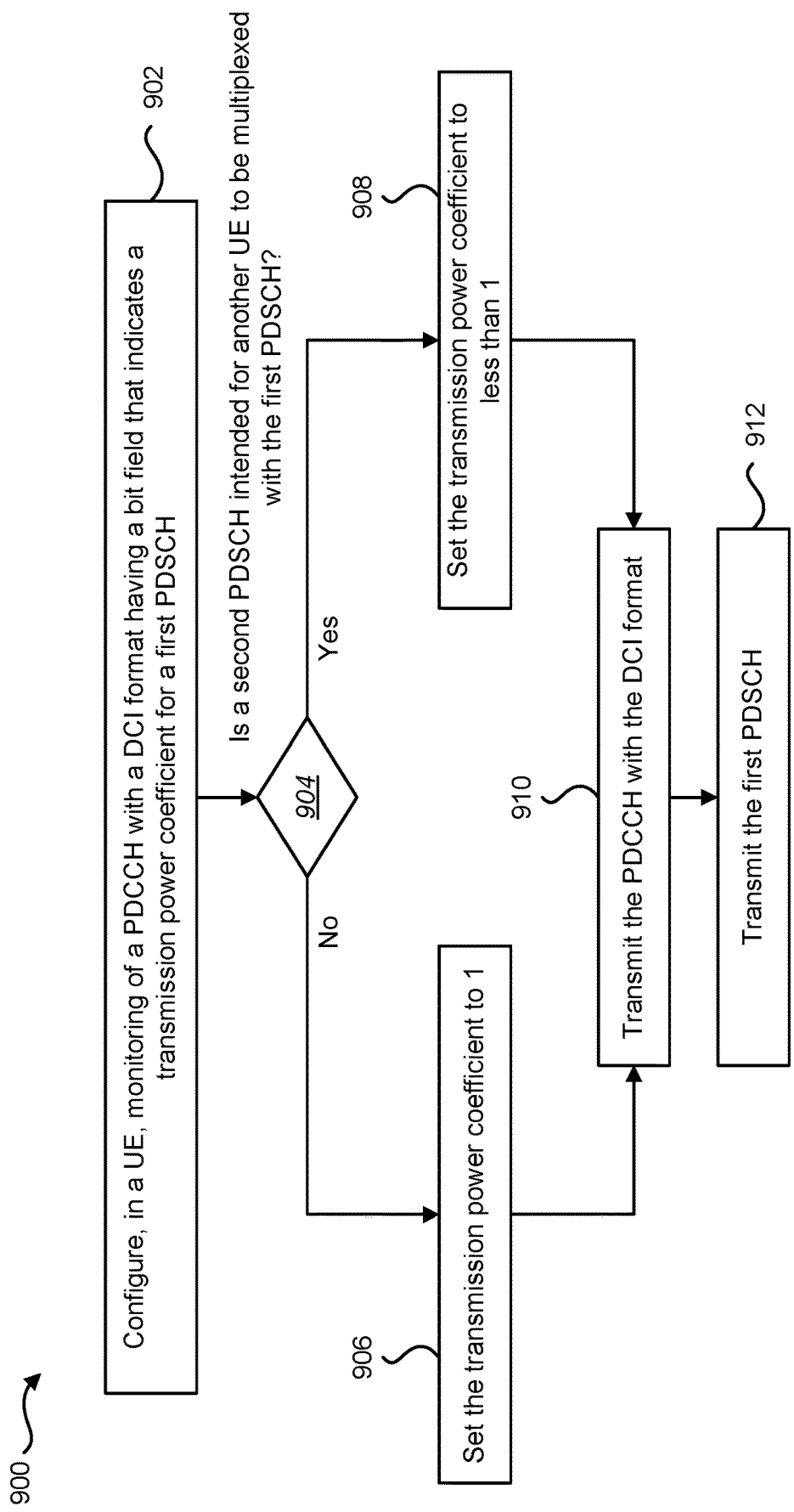
FIG. 9 is a flow diagram illustrating one implementation of a method for multiuser superposition transmission (MUST) operation by an eNB.

FIG. 9 is a flow diagram illustrating one implementation of a method 900 for multiuser superposition transmission (MUST) operation by an eNB 160. The eNB 160 may communicate with a UE 102. For example, the eNB 160 may perform a MUST transmission with a first UE 102*a* and a second UE 102*b*.

The eNB 160 may configure 902, in the UE 102, monitoring of a physical downlink control channel (PDCCH) with a downlink control information (DCI) format having a bit field. For example, the eNB 160 may include a higher layer processor that configures monitoring of the PDCCH in the UE 102. The bit field may indicate a transmission power coefficient for a first PDSCH intended for the UE 102.

The eNB 160 may determine 904 whether a second PDSCH intended for another UE 102 is to be multiplexed with the first PDSCH. If no other PDSCH is multiplexed with the first PDSCH, then the eNB 160 may set 906 the transmission power coefficient to 1. If a second PDSCH is multiplexed with the first PDSCH, the eNB 160 may set 908 the transmission power coefficient is set to a value less than 1. In this case, the bit field may also indicate a transmission scheme of the second PDSCH.

The eNB 160 may transmit 910 the PDCCH with the DCI format. For example, the eNB 160 may include a PDCCH transmitter configured to transmit the PDCCH with the DCI format.

The eNB 160 may transmit 912 the first PDSCH. For example, the eNB 160 may include a PDSCH transmitter configured to transmit the first PDSCH.

Figure 10:
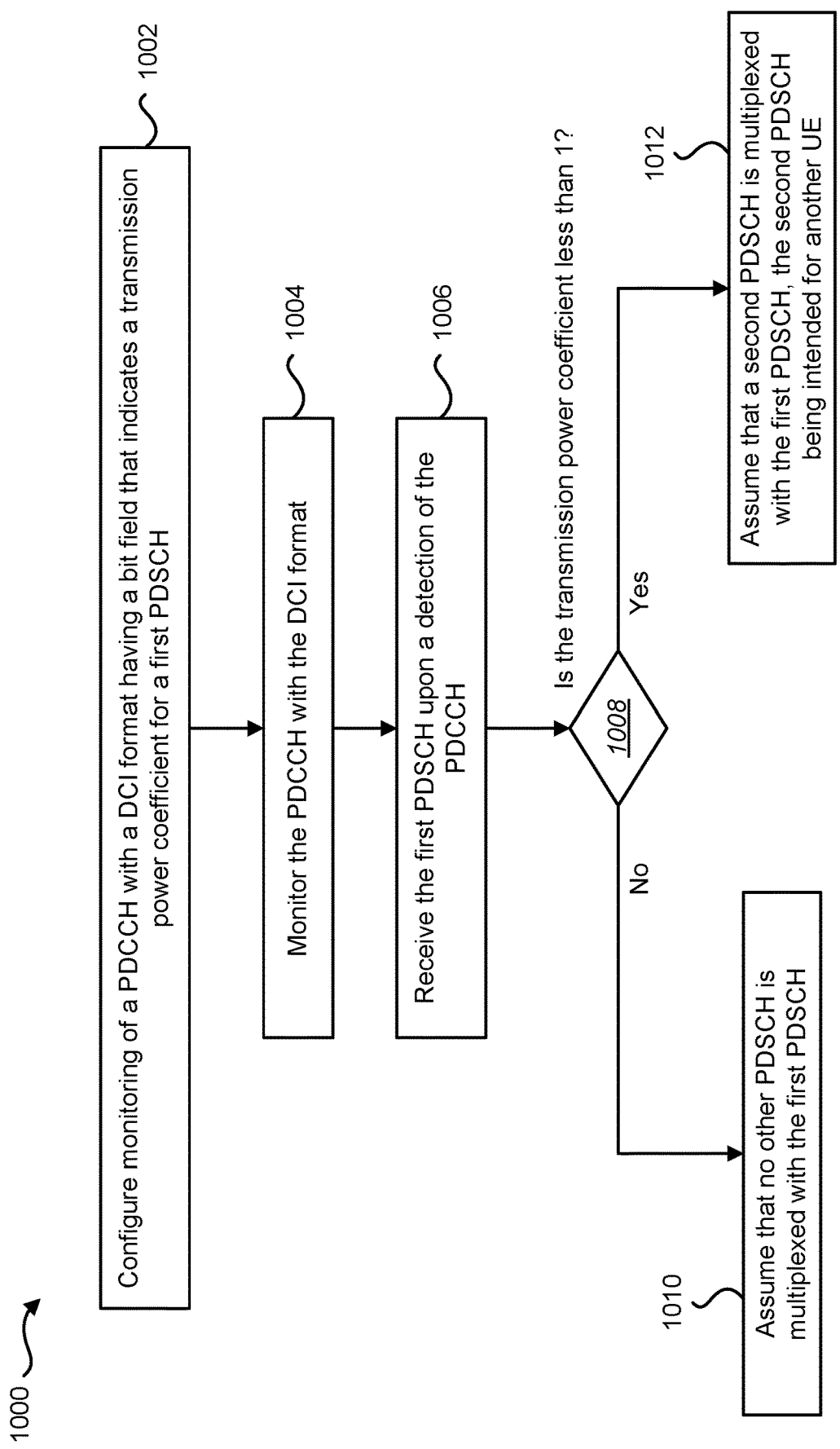
FIG. 10 is a flow diagram illustrating one implementation of a method for MUST operation by a first UE.

FIG. 10 is a flow diagram illustrating one implementation of a method 1000 for MUST operation by a first UE 102*a*. The first UE 102*a* may communicate with an eNB 160. For example, the first UE 102*a* may receive a MUST transmission from the eNB 160 that is intended for the first UE 102*a* and a second UE 102*b*.

The first UE 102*a* may configure 1002 monitoring of a PDCCH with a DCI format having a bit field. For example, the first UE 102*a* may include a higher layer processor that configures monitoring of the PDCCH in the first UE 102*a*. The configuration may be performed by higher layer signaling (e.g., through dedicated RRC message). The bit field may indicate a transmission power coefficient for a first PDSCH intended for the first UE 102*a*.

The first UE 102*a* may monitor 1004 the PDCCH with the DCI format. For example, the eNB 160 may send the PDCCH with the DCI format. The first UE 102*a* may include a PDCCH receiver configured to monitor the PDCCH with the DCI format.

The first UE 102*a* may receive 1006 a first PDSCH upon a detection of the PDCCH. For example, the eNB 160 may send the first PDSCH. The first UE 102*a* may include a PDSCH receiver configured to receive the first PDSCH upon detection of the PDCCH.

The first UE 102*a* may determine 1008 whether the transmission power coefficient of the DCI format bit field is less than 1. If the transmission power coefficient is equal to 1 (i.e., not less than 1), then the first UE 102*a* may assume 1010 that that no other PDSCH is multiplexed with the first PDSCH.

If the first UE 102*a* determines 1008 that the transmission power coefficient is less than 1, then the first UE 102*a* may assume 1012 that a second PDSCH is multiplexed with the first PDSCH, the second PDSCH being intended for another UE 102 (e.g., the second UE 102*b*). In this case, the bit field may also indicate a transmission scheme of the second PDSCH.

Figure 11:
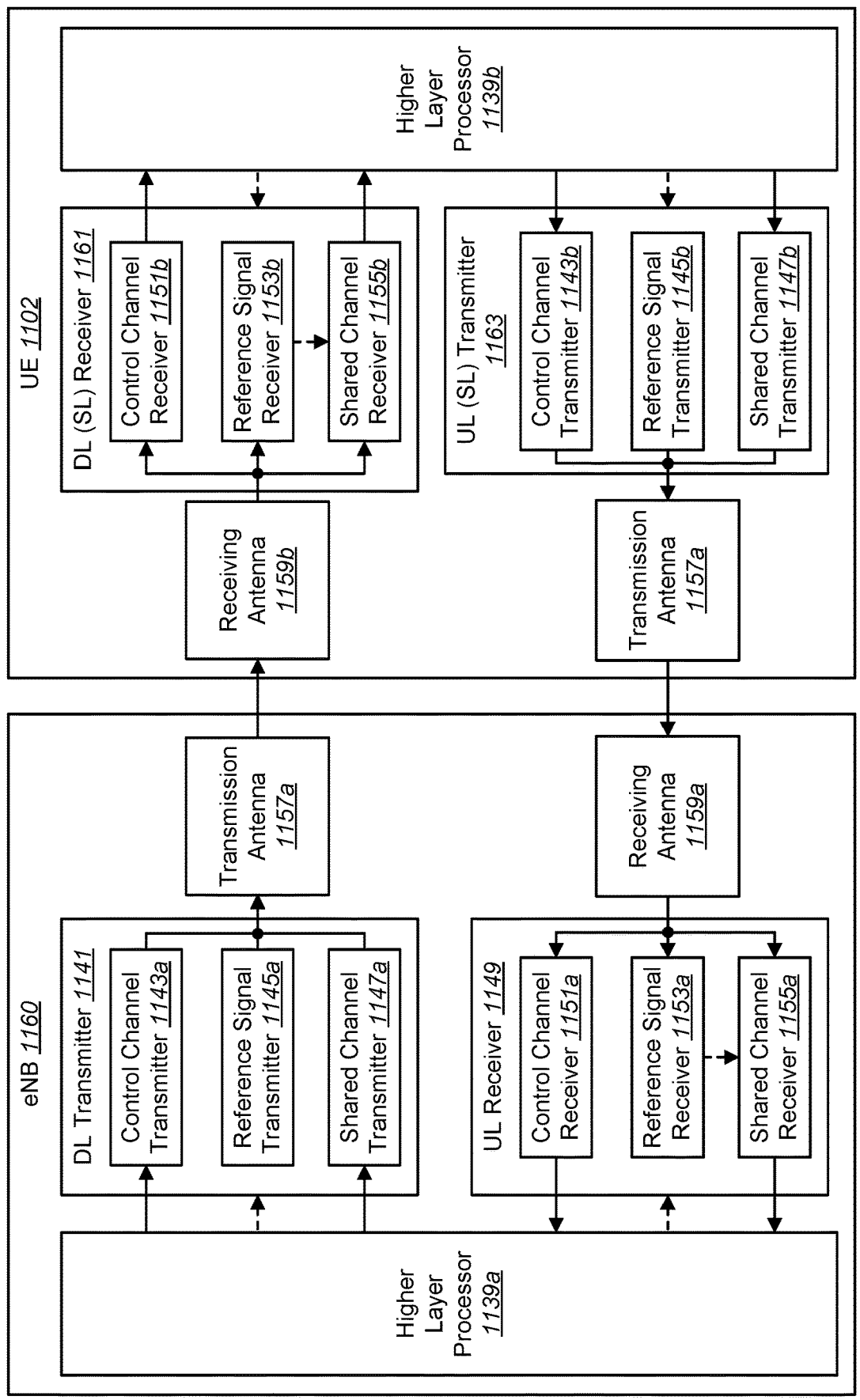
FIG. 11 is block diagram illustrating a detailed configuration of an eNB and a UE in which systems and methods for MUST may be implemented.

FIG. 11 is block diagram illustrating a detailed configuration of an eNB 1160 and a UE 1102 in which systems and methods for Multiuser Superposition Transmission (MUST) may be implemented. The eNB 1160 may include a higher layer processor 1139*a*, a DL transmitter 1141 and a UL receiver 1149. The higher layer processor 1139*a* may communicate with the DL transmitter 1141, UL receiver 1149 and subsystems of each.

The DL transmitter 1141 may include a control channel transmitter 1143*a* (also referred to as PDCCH transmitter), a reference signal transmitter 1145*a* and a shared channel transmitter 1147*a* (also referred to as PDSCH transmitter). The DL transmitter 1141 may transmit signals/channels to the UE 1102 using a transmission antenna 1157*a*.

The UL receiver 1149 may include a control channel receiver 1151*a* (also referred to as a physical uplink control channel (PUCCH) receiver), a reference signal receiver 1153*a* and a shared channel receiver 1155*a* (also referred to as a physical uplink shared channel (PUSCH) receiver). The UL receiver 1149 may receive signals/channels from the UE 1102 using a receiving antenna 1159*a*. The reference signal receiver 1153*a* may provide signals to the shared channel receiver 1155*a* based on the received reference signals.

The higher layer processor 1139*a* may generate higher layer signaling information (e.g. RRC messages) to configure parameters in the UE 1102. The control channel transmitter 1143*a* (i.e., PDCCH transmitter) may generate PDCCH and/or EPDCCH. The shared channel transmitter 1147*a* (i.e., PDSCH transmitter) may generate PDSCH. The reference signal transmitter 1145*a* may transmit a downlink reference signal.

The UE 1102 may include a higher layer processor 1139*b* a DL (SL) receiver 1161 and a UL (SL) transmitter 1163. The higher layer processor 1139*b* may communicate with the DL (SL) receiver 1161, UL (SL) transmitter 1163 and subsystems of each.

The DL (SL) receiver 1161 may include a control channel receiver 1151*b* (also referred to as a PDCCH receiver), a reference signal receiver 1153*b* and a shared channel receiver 1155*b* (also referred to as PDSCH receiver). The DL (SL) receiver 1161 may receive signals/channels from the UE 1102 using a receiving antenna 1159*b*. The reference signal receiver 1153*b* may provide signals to the shared channel receiver 1155*b* based on the received reference signals. For example, the shared channel receiver 1155*b* may be configured to receive the PDSCH for which the same antenna port is used as for the reference signals.

The UL (SL) transmitter 1163 may include a control channel transmitter 1143*b* (also referred to as PUCCH transmitter), a reference signal transmitter 1145*a* and a shared channel transmitter 1147*b* (also referred to as PUSCH transmitter). The UL (SL) transmitter 1163 may send signals/channels to the eNB 1160 using a transmission antenna 1157*b*.

The higher layer processor 1139*b* may acquire higher layer signaling information (e.g. RRC messages) and control configuration of the UE 1102 based on the higher layer signaling information. The control channel receiver 1151*b* (i.e., PDCCH receiver) may attempt to decode PDCCH and/or EPDCCH. The shared channel receiver 1155*b* (i.e., PDSCH receiver) may receive PDSCH when the corresponding (E)PDCCH is detected. The reference signal receiver 1153*b* may perform channel measurement or channel estimation using a downlink reference signal.

Figure 12:
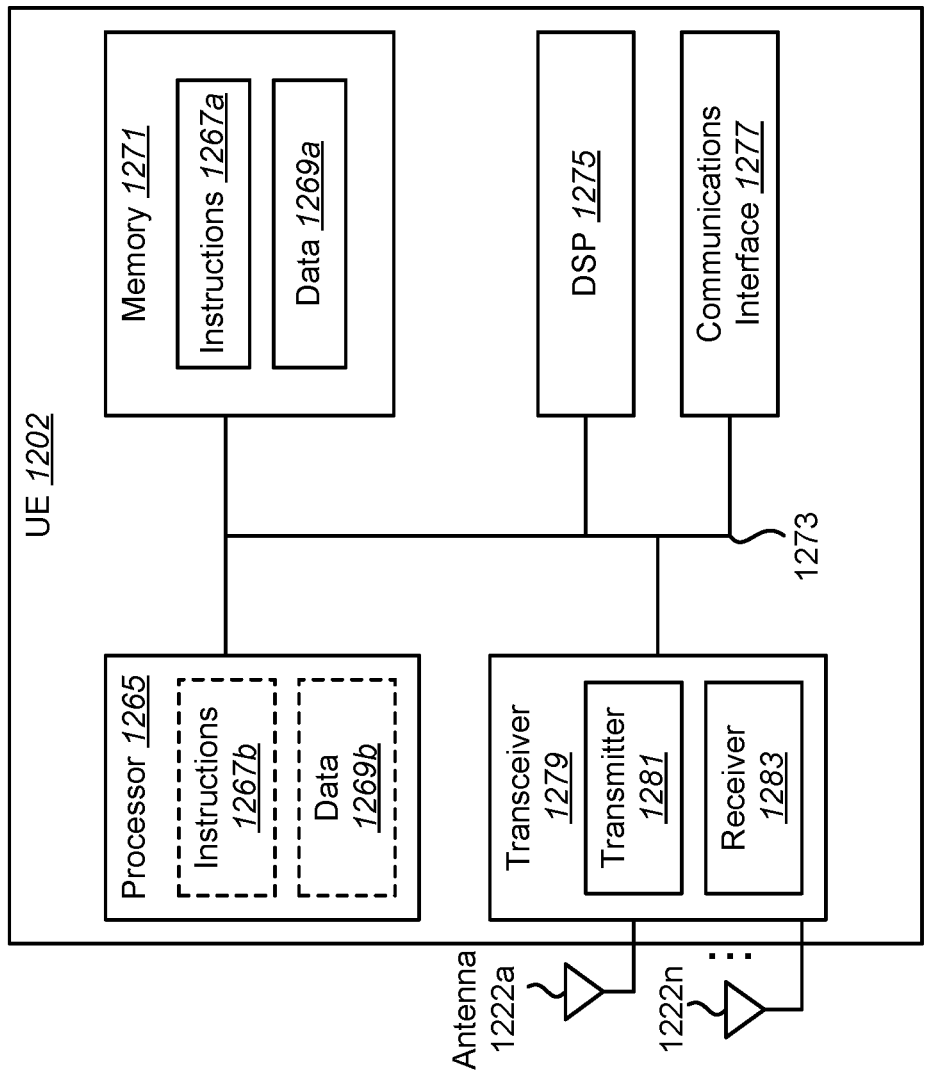
FIG. 12 illustrates various components that may be utilized in a UE.

FIG. 12 illustrates various components that may be utilized in a UE 1202. The UE 1202 described in connection with FIG. 12 may be implemented in accordance with the UE 102 described in connection with FIG. 1. The UE 1202 includes a processor 1265 that controls operation of the UE 1202. The processor 1265 may also be referred to as a central processing unit (CPU). Memory 1271, which may include read-only memory (ROM), random access memory (RAM), a combination of the two or any type of device that may store information, provides instructions 1267*a* and data 1269*a* to the processor 1265. A portion of the memory 1271 may also include non-volatile random access memory (NVRAM). Instructions 1267*b* and data 1269*b* may also reside in the processor 1265. Instructions 1267*b* and/or data 1269*b* loaded into the processor 1265 may also include instructions 1267*a* and/or data 1269*a* from memory 1271 that were loaded for execution or processing by the processor 1265. The instructions 1267*b* may be executed by the processor 1265 to implement one or more of the methods 800 and 1000 described above.

The UE 1202 may also include a housing that contains one or more transmitters 1281 and one or more receivers 1283 to allow transmission and reception of data. The transmitter(s) 1281 and receiver(s) 1283 may be combined into one or more transceivers 1279. One or more antennas 1222*a-n* are attached to the housing and electrically coupled to the transceiver 1279.

The various components of the UE 1202 are coupled together by a bus system 1273, which may include a power bus, a control signal bus and a status signal bus, in addition to a data bus. However, for the sake of clarity, the various buses are illustrated in FIG. 12 as the bus system 1273. The UE 1202 may also include a digital signal processor (DSP) 1275 for use in processing signals. The UE 1202 may also include a communications interface 1277 that provides user access to the functions of the UE 1202. The UE 1202 illustrated in FIG. 12 is a functional block diagram rather than a listing of specific components.

Figure 13:
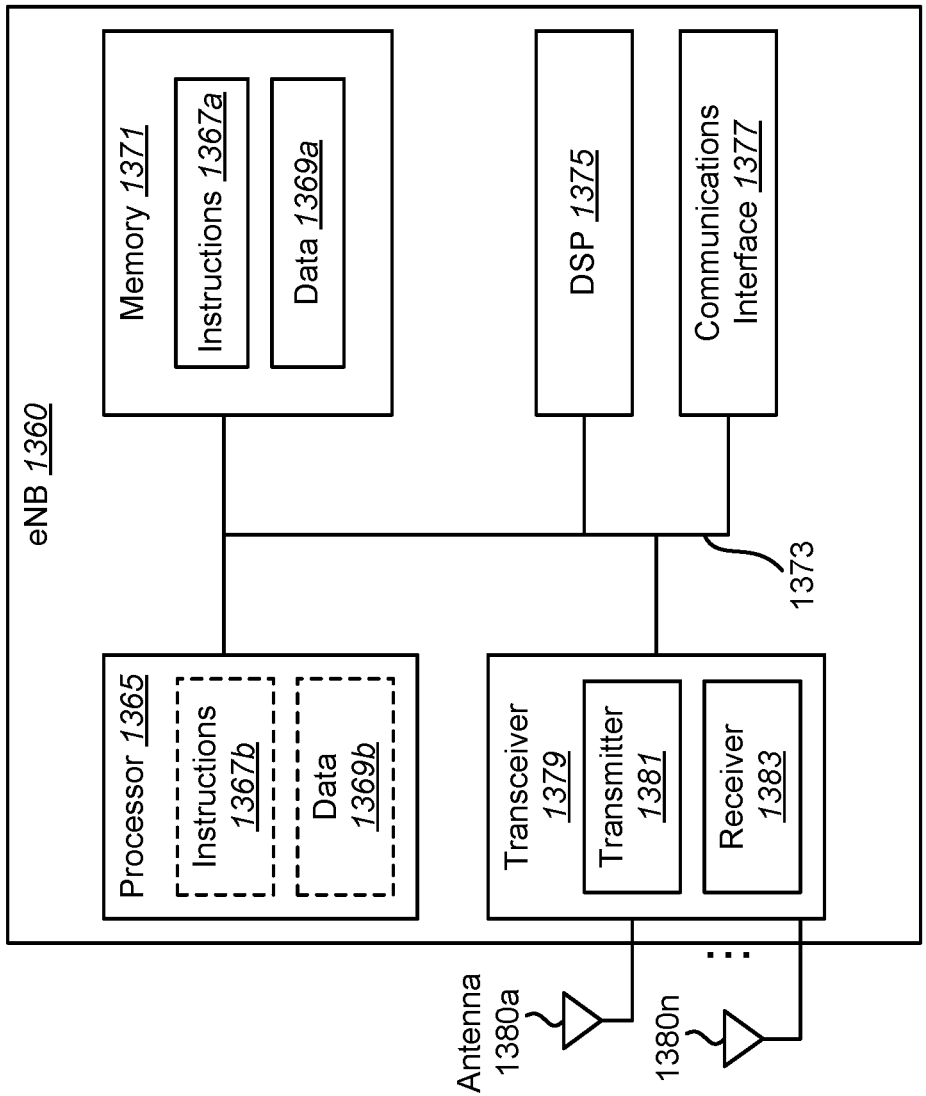
FIG. 13 illustrates various components that may be utilized in an eNB.

FIG. 13 illustrates various components that may be utilized in an eNB 1360. The eNB 1360 described in connection with FIG. 13 may be implemented in accordance with the eNB 160 described in connection with FIG. 1. The eNB 1360 includes a processor 1365 that controls operation of the eNB 1360. The processor 1365 may also be referred to as a central processing unit (CPU). Memory 1371, which may include read-only memory (ROM), random access memory (RAM), a combination of the two or any type of device that may store information, provides instructions 1367*a* and data 1369*a* to the processor 1365. A portion of the memory 1371 may also include non-volatile random access memory (NVRAM). Instructions 1367*b* and data 1369*b* may also reside in the processor 1365. Instructions 1367*b* and/or data 1369*b* loaded into the processor 1365 may also include instructions 1367*a* and/or data 1369*a* from memory 1371 that were loaded for execution or processing by the processor 1365. The instructions 1367*b* may be executed by the processor 1365 to implement the methods 700 and 900 described above.

The eNB 1360 may also include a housing that contains one or more transmitters 1381 and one or more receivers 1383 to allow transmission and reception of data. The transmitter(s) 1381 and receiver(s) 1383 may be combined into one or more transceivers 1379. One or more antennas 1380*a-n* are attached to the housing and electrically coupled to the transceiver 1379.

The various components of the eNB 1360 are coupled together by a bus system 1373, which may include a power bus, a control signal bus and a status signal bus, in addition to a data bus. However, for the sake of clarity, the various buses are illustrated in FIG. 13 as the bus system 1373. The eNB 1360 may also include a digital signal processor (DSP) 1375 for use in processing signals. The eNB 1360 may also include a communications interface 1377 that provides user access to the functions of the eNB 1360. The eNB 1360 illustrated in FIG. 13 is a functional block diagram rather than a listing of specific components.

Figure 14:
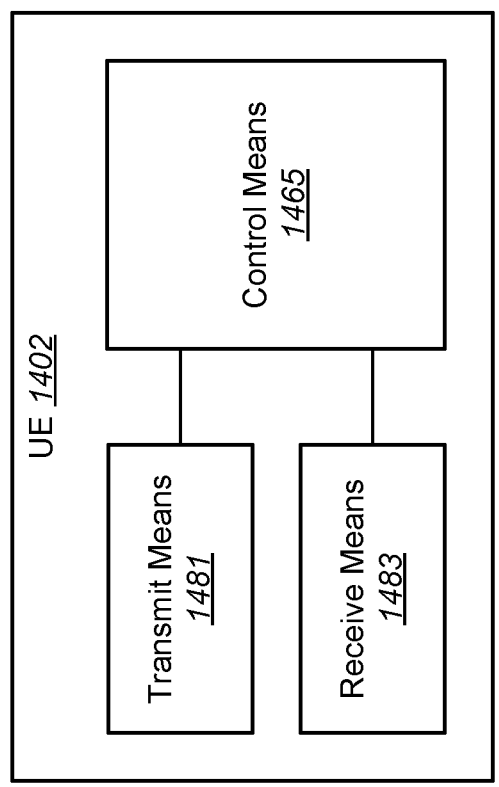
FIG. 14 is a block diagram illustrating one implementation of a UE in which systems and methods for performing MUST may be implemented.

FIG. 14 is a block diagram illustrating one implementation of a UE 1402 in which systems and methods for performing MUST may be implemented. The UE 1402 includes transmit means 1481, receive means 1483 and control means 1465. The transmit means 1481, receive means 1483 and control means 1465 may be configured to perform one or more of the functions described in connection with FIG. 1 above. FIG. 12 above illustrates one example of a concrete apparatus structure of FIG. 14. Other various structures may be implemented to realize one or more of the functions of FIG. 1. For example, a DSP may be realized by software.

Figure 15:
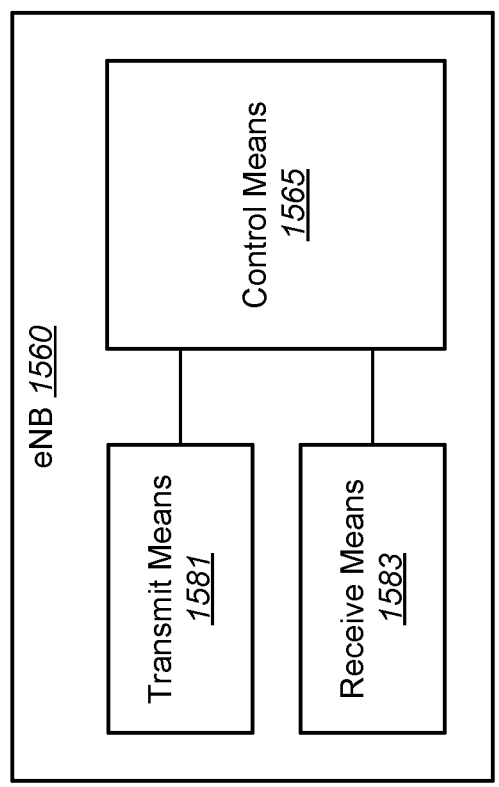
FIG. 15 is a block diagram illustrating one implementation of an eNB in which systems and methods for performing MUST may be implemented.

FIG. 15 is a block diagram illustrating one implementation of an eNB 1560 in which systems and methods for performing MUST may be implemented. The eNB 1560 includes transmit means 1581, receive means 1583 and control means 1565. The transmit means 1581, receive means 1583 and control means 1565 may be configured to perform one or more of the functions described in connection with FIG. 1 above. FIG. 13 above illustrates one example of a concrete apparatus structure of FIG. 15. Other various structures may be implemented to realize one or more of the functions of FIG. 1. For example, a DSP may be realized by software.

The term "computer-readable medium" refers to any available medium that can be accessed by a computer or a processor. The term "computer-readable medium," as used herein, may denote a computer- and/or processor-readable medium that is non-transitory and tangible. By way of example, and not limitation, a computer-readable or processor-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer or processor. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

It should be noted that one or more of the methods described herein may be implemented in and/or performed using hardware. For example, one or more of the methods described herein may be implemented in and/or realized using a chipset, an application-specific integrated circuit (ASIC), a large-scale integrated circuit (LSI) or integrated circuit, etc.

Each of the methods disclosed herein comprises one or more steps or actions for achieving the described method. The method steps and/or actions may be interchanged with one another and/or combined into a single step without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the systems, methods, and apparatus described herein without departing from the scope of the claims.

A program running on the eNB 160 or the UE 102 according to the described systems and methods is a program (a program for causing a computer to operate) that controls a CPU and the like in such a manner as to realize the function according to the described systems and methods. Then, the information that is handled in these apparatuses is temporarily stored in a RAM while being processed. Thereafter, the information is stored in various ROMs or HDDs, and whenever necessary, is read by the CPU to be modified or written. As a recording medium on which the program is stored, among a semiconductor (for example, a ROM, a nonvolatile memory card, and the like), an optical storage medium (for example, a DVD, a MO, a MD, a CD, a BD, and the like), a magnetic storage medium (for example, a magnetic tape, a flexible disk, and the like), and the like, any one may be possible. Furthermore, in some cases, the function according to the described systems and methods described above is realized by running the loaded program, and in addition, the function according to the described systems and methods is realized in conjunction with an operating system or other application programs, based on an instruction from the program.

Furthermore, in a case where the programs are available on the market, the program stored on a portable recording medium can be distributed or the program can be transmitted to a server computer that connects through a network such as the Internet. In this case, a storage device in the server computer also is included. Furthermore, some or all of the eNB 160 and the UE 102 according to the systems and methods described above may be realized as an LSI that is a typical integrated circuit. Each functional block of the eNB 160 and the UE 102 may be individually built into a chip, and some or all functional blocks may be integrated into a chip. Furthermore, a technique of the integrated circuit is not limited to the LSI, and an integrated circuit for the functional block may be realized with a dedicated circuit or a general-purpose processor. Furthermore, if with advances in a semiconductor technology, a technology of an integrated circuit that substitutes for the LSI appears, it is also possible to use an integrated circuit to which the technology applies.

Moreover, each functional block or various features of the base station device (i.e., eNB) and the terminal device (i.e., UE) used in each of the aforementioned embodiments may be implemented or executed by a circuitry, which is typically an integrated circuit or a plurality of integrated circuits. The circuitry designed to execute the functions described in the present specification may comprise a general-purpose processor, a digital signal processor (DSP), an application specific or general application integrated circuit (ASIC), a field programmable gate array (FPGA), or other programmable logic devices, discrete gates or transistor logic, or a discrete hardware component, or a combination thereof. The general-purpose processor may be a microprocessor, or alternatively, the processor may be a conventional processor, a controller, a microcontroller or a state machine. The general-purpose processor or each circuit described above may be configured by a digital circuit or may be configured by an analogue circuit. Further, when a technology of making into an integrated circuit superseding integrated circuits at the present time appears due to advancement of a semiconductor technology, the integrated circuit by this technology is also able to be used.

What is claimed is:

1. A user equipment (UE) comprising:
   physical downlink control channel (PDCCH) receiving circuitry configured to receive a PDCCH with a downlink control information (DCI) format; and
   physical downlink shared channel (PDSCH) receiving circuitry configured to receive a PDSCH upon the detection of the PDCCH; wherein
   the DCI format has a 5-bit information field and a 2-bit information field in which the 5-bit information field indicates one of at least a first modulation scheme and a second modulation scheme of the UE, the 2-bit information field indicates multiuser superposition transmission (MUST) interference presence and power ratio, and the power ratio is a ratio of power of the UE,
   in a case that the 2-bit information field is not set to '00' and the 5-bit information field indicates the first modulation scheme, a first table is used for determining the power ratio, the first table including a value '01' set by the 2-bit information field, a value '10' set by the 2-bit information field, a value '11' set by the 2-bit information field, a first power ratio corresponding to the value '01', a second power ratio corresponding to the value '10', and a third power ratio corresponding to the value '11', and
   in a case that the 2-bit information field is not set to '00' and the 5-bit information field indicates the second modulation scheme, a second table is used for determining the power ratio, the second table including the value '01' set by the 2-bit information field, the value '10' set by the 2-bit information field, the value '11' set by the 2-bit information field, a fourth power ratio corresponding to the value '01', a fifth power ratio corresponding to the value '10', and a sixth power ratio corresponding to the value '11', the fourth power ratio being different from the first power ratio, the fifth power ratio being different from the second power ratio, and the sixth power ratio being different from the third power ratio.

2. The UE according to claim 1, wherein based on the values and the modulation scheme, the UE demodulates the PDSCH as the UE's own received data.

3. The UE according to claim 1, wherein in a case that the 2-bit information field is set to '00', correspondence between values indicated by the 2-bit information field and power ratios does not depend on the modulation scheme.

4. The UE according to claim 3, wherein based on the values and the modulation scheme, the UE demodulates the PDSCH as the UE's own received data.

5. The UE according to claim 1, wherein in a case that the 2-bit information field is set to '00', the UE assumes that MUST interference is not present.

6. An evolved node B (eNB) communicating with a user equipment (UE), the eNB comprising:

physical downlink control channel (PDCCH) transmitting circuitry configured to transmit the PDCCH with a downlink control information (DCI) format; and physical downlink shared channel (PDSCH) transmitting circuitry configured to transmit a PDSCH; wherein the DCI format has a 5-bit information field and a 2-bit information field in which the 5-bit information field indicates one of at least a first modulation scheme and a second modulation scheme of the UE, the 2-bit information field indicates multiuser superposition transmission (MUST) interference presence and power ratio, and the power ratio is a ratio of power of the UE, in a case that the 2-bit information field is not set to '00' and the 5-bit information field indicates the first modulation scheme, a first table is used for determining the power ratio, the first table including a value '01' set by the 2-bit information field, a value '10' set by the 2-bit information field, a value '11' set by the 2-bit information field, a first power ratio corresponding to the value '01', a second power ratio corresponding to the value '10' and a third power ratio corresponding to the value '11', and in a case that the 2-bit information field is not set to '00' and the 5-bit information field indicates the second modulation scheme, a second table is used for determining the power ratio, the second table including the value '01' set by the 2-bit information field, the value '10' set by the 2-bit information field, the value '11' set by the 2-bit information field, a fourth power ratio corresponding to the value '01', a fifth power ratio corresponding to the value '10' and a sixth power ratio corresponding to the value '11', the fourth power ratio being different from the first power ratio, the fifth power ratio being different from the second power ratio, and the sixth power ratio being different from the third power ratio.

7. The eNB according to claim 6, wherein in a case that the 2-bit information field is set to '00', correspondence between values indicated by the 2-bit information field and power ratios does not depend on the modulation scheme.

8. The eNB according to claim 6, wherein in a case that the 2-bit information field is set to '00', the eNB does not perform MUST multiplexing.

9. A method for a user equipment (UE), the method comprising:

receiving a physical downlink control channel (PDCCH) with a downlink control information (DCI) format; and receiving a physical downlink shared channel (PDSCH) upon the detection of the PDCCH; wherein the DCI format has a 5-bit information field and a 2-bit information field in which the 5-bit information field indicates one of at least a first modulation scheme and a second modulation scheme of the UE, the 2-bit information field indicates multiuser superposition transmission (MUST) interference presence and power ratio, and the power ratio is a ratio of power of the UE, in a case that the 2-bit information field is not set to '00' and the 5-bit information field indicates the first modulation scheme, a first table is used for determining the power ratio, the first table including a value '01' set by the 2-bit information field, a value '10' set by the 2-bit information field, a value '11' set by the 2-bit information field, a first power ratio corresponding to the value '01', a second power ratio corresponding to the value '10' and a third power ratio corresponding to the value '11', and in a case that the 2-bit information field is not set to '00' and the 5-bit information field indicates the second modulation scheme, a second table is used for determining the power ratio, the second table including the value '01' set by the 2-bit information field, the value '10' set by the 2-bit information field, the value '11' set by the 2-bit information field, a fourth power ratio corresponding to the value '01', a fifth power ratio corresponding to the value '10' and a sixth power ratio corresponding to the value '11', the fourth power ratio being different from the first power ratio, the fifth power ratio being different from the second power ratio, and the sixth power ratio being different from the third power ratio.

10. The method according to claim 9, wherein in a case that the 2-bit information field is set to '00', correspondence between values indicated by the 2-bit information field and power ratios does not depend on the modulation scheme.

11. A method for an evolved node B (eNB) communicating with a user equipment (UE), the eNB comprising:

transmitting a physical downlink control channel (PDCCH) with a downlink control information (DCI) format; and transmitting a physical downlink shared channel (PDSCH) upon the detection of the PDCCH; wherein the DCI format has a 5-bit information field and a 2-bit information field in which the 5-bit information field indicates one of at least a first modulation scheme and a second modulation scheme of the UE, the 2-bit information field indicates multiuser superposition transmission (MUST) interference presence and power ratio, and the power ratio is a ratio of power of the UE, in a case that the 2-bit information field is not set to '00' and the 5-bit information field indicates the first modulation scheme, a first table is used for determining the power ratio, the first table including a value '01' set by the 2-bit information field, a value '10' set by the 2-bit information field, a value '11' set by the 2-bit information field, a first power ratio corresponding to the value '01', a second power ratio corresponding to the value '10', and a third power ratio corresponding to the value '11', and in a case that the 2-bit information field is not set to '00' and the 5-bit information field indicates the second modulation scheme, a second table is used for determining the power ratio, the second table including the value '01' set by the 2-bit information field, the value '10' set by the 2-bit information field, the value '11' set by the 2-bit information field, a fourth power ratio corresponding to the value '01', a fifth power ratio corresponding to the value '10', and a sixth power ratio corresponding to the value '11', the fourth power ratio being different from the first power ratio, the fifth power ratio being different from the second power ratio, and the sixth power ratio being different from the third power ratio.

12. The method according to claim 11, wherein in a case that the 2-bit information field is set to '00', correspondence between values indicated by the 2-bit information field and power ratios does not depend on the modulation scheme.

* * * * *